(12) United States Patent
Hanzawa et al.

(10) Patent No.: US 8,179,739 B2
(45) Date of Patent: May 15, 2012

(54) SEMICONDUCTOR DEVICE AND ITS MANUFACTURING METHOD

(75) Inventors: Satoru Hanzawa, Hachioji (JP); Fumihiko Nitta, Toyonaka (JP); Nozomu Matsuzaki, Kodaira (JP); Toshihiro Tanaka, Akiruno (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 284 days.

(21) Appl. No.: 12/672,685

(22) PCT Filed: Aug. 10, 2007

(86) PCT No.: PCT/JP2007/065686
§ 371 (c)(1),
(2), (4) Date: Feb. 8, 2010

(87) PCT Pub. No.: WO2009/022373
PCT Pub. Date: Feb. 19, 2009

(65) Prior Publication Data
US 2011/0211390 A1  Sep. 1, 2011

(51) Int. Cl.
*G11C 8/00* (2006.01)
(52) U.S. Cl. .............. 365/230.06; 365/207; 365/230.03; 365/230.08; 365/100
(58) Field of Classification Search ............. 365/230.06, 365/207, 230.03, 230.08, 100
See application file for complete search history.

(56) References Cited

U.S. PATENT DOCUMENTS

| | | | |
|---|---|---|---|
| 2005/0111247 A1 | 5/2005 | Takaura et al. | |
| 2006/0139999 A1* | 6/2006 | Sakata et al. | 365/185.12 |
| 2006/0157680 A1 | 7/2006 | Takaura et al. | |
| 2006/0209585 A1 | 9/2006 | Tanizaki et al. | |
| 2006/0226459 A1 | 10/2006 | Oh et al. | |
| 2006/0228908 A1 | 10/2006 | Chung et al. | |

(Continued)

FOREIGN PATENT DOCUMENTS

JP    2004-349504 A    12/2004

(Continued)

OTHER PUBLICATIONS

Stefan Lai et al., "OUM-A 180 nm Nonvolatile memory Cell Element Technology for Stand Alone and Embedded Applications", IEEE International Electron Devices Meeting, Technical Digest, (USA), 2001, pp. 803-806.
Lee et al., "A 90nm 1.8V 512Mb Diode-Switch PRAM with 266MB/s Read Throughput", IEEE International Solid-State Circuits Conference, Digest of Technical Papers, (USA), 2007, pp. 472-473.

(Continued)

*Primary Examiner* — Thong Q Le
(74) *Attorney, Agent, or Firm* — Miles & Stockbridge P.C.

(57) ABSTRACT

A technique capable of manufacturing a semiconductor device without posing contamination in a manufacturing apparatus regarding a phase change memory including a memory cell array formed of memory cells using a storage element (RE) by a variable resistor and a select transistor (CT). A buffer cell is arranged between a sense amplifier (SA) and a memory cell array (MCA) and between a word driver (WDB) and the memory cell array. The buffer cell is formed of the resistive storage element (RE) and the select transistor (CT) same as those of the memory cell. The resistive storage element in the memory cell is connected to a bit-line via a contact formed above the resistive storage element. Meanwhile, in the buffer cell, the contact is not formed above the resistive storage element, and a state of being covered with an insulator is kept upon processing the contact in the memory cell. By such a processing method, exposure and sublimation of a chalcogenide film used in the resistive storage element can be avoided.

12 Claims, 25 Drawing Sheets

U.S. PATENT DOCUMENTS

2008/0144347 A1    6/2008    Takemura et al.

FOREIGN PATENT DOCUMENTS

| | | |
|---|---|---|
| JP | 2006-294206 A | 10/2006 |
| JP | 2006-295117 A | 10/2006 |
| JP | 2006-295177 A | 10/2006 |
| WO | WO-2005/117118 A1 | 12/2005 |

OTHER PUBLICATIONS

Hanzawa et al., "A 512kB Embedded Phase Change memory with 416kB/s Write Throughput at 100µA Cell Write Current", IEEE International Solid-State Circuits Conference, Digest of Technical Papers, (USA), 2007, pp. 474-475.

\* cited by examiner

FIG. 23A
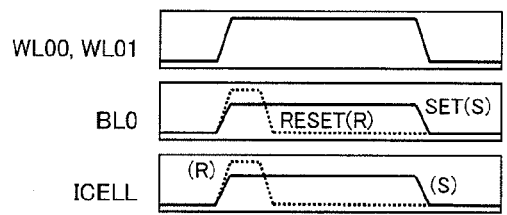
FIG. 23B
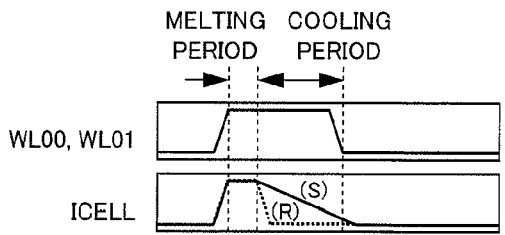
FIG. 23C
FIG. 23D
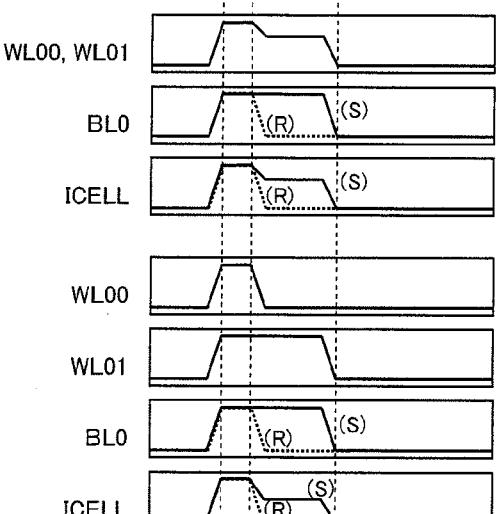
FIG. 23E
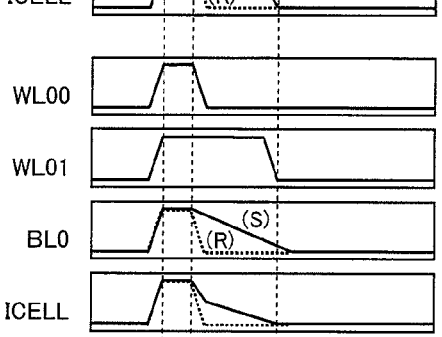
FIG. 23F
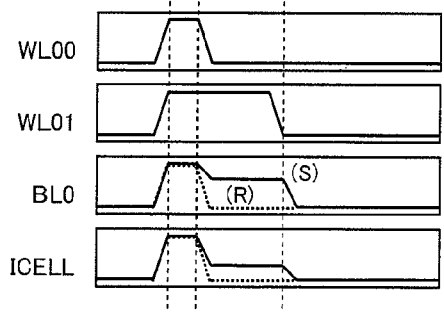

SEMICONDUCTOR DEVICE AND ITS MANUFACTURING METHOD

TECHNICAL FIELD

The present invention relates to a semiconductor device and a method of manufacturing the same, and to a technique effectively applied to a storage device including a memory cell formed of a device having a resistance value that varies corresponding to storage information, in particular, a storage device including a phase change memory using a memory cell which stores information utilizing a state change of a chalcogenide material and detects a resistance value difference from the information to discriminate the information.

BACKGROUND ART

As a technique which has been studied by the present inventors, for example, the following technique has been considered regarding a semiconductor device including a phase change memory.

A storage element uses a chalcogenide material (or phase change material) such as Ge—Sb—Te-based or Ag—In—Sb—Te-based one containing at least antimony (Sb) and tellurium (Te) as materials for a storage layer. The characteristics of the phase change memory using the chalcogenide material are described, for example, in Non-Patent Document 1.

FIG. 2 is a graph illustrating a relationship between a pulse width and a temperature which are required for phase change of a resistive storage element using a phase change material. When storage information "0" is written in the resistive storage element, such a reset pulse as to heat the device up to a melting point Ta of a chalcogenide material or higher and to rapidly cool the same is applied to the device, as illustrated in FIG. 2. By setting a cooling time t1 short, for example, to about 1 ns, the chalcogenide material is changed to a high-resistance amorphous (noncrystalline) state.

On the contrary, when writing of storage information "1" is performed, the chalcogenide material is changed to a poly crystal state having a low resistance by applying such a set pulse as to hold the temperature of the resistive storage element in a temperature range lower than the melting point Ta and higher than a crystallization temperature Tx that is higher than or equal to a glass-transition temperature. A time required for crystallization t2 varies depending on the composition of the chalcogenide material. The temperature of the device illustrated in FIG. 2 depends on Joule heat which the resistive storage element itself generates and on thermal diffusion to the environment.

A typical phase change memory includes a memory-cell array MCA, a block of word drivers WDB, a multiplexer MUX, a program circuit PRGM, and a sense amplifier SA, as illustrated in FIG. 3. The memory-cell array MCA includes memory cells MC00, MC10, . . . arranged in matrix at intersection points of word lines WL0, WL1, . . . and bit-lines BL0, BL1, . . . . The memory cell has a configuration in which the abovementioned resistive storage element RE and a select transistor CT are inserted between the bit-line BL0 and a ground terminal, for example, as illustrated in MC00. A gate electrode of the select transistor CT is connected to the word line WL0. The block of word drivers WDB selects one from the word lines WL0, WL1, . . . in response to an address signal (not illustrated). The multiplexer MUX selects one from the bit-lines BL0, BL1, . . . in response to an address signal (not illustrated) and connects the bit-line to the program circuit PRGM or the sense amplifier SA.

In Patent Document 1, a layout structure of a semiconductor memory device having a hierarchical structure and a layout method thereof are described. Specifically, the same structure as that of the memory cell is formed on a wiring area for a global bit-line and a regularity of a layout pattern of a structure in a memory-cell array is maintained. In Patent Document 2, such disposing a structure similar to that of the memory cell around a memory-cell array is described.

Patent Document 1: Japanese Patent Application Laid-Open Publication No. 2006-295117
Patent Document 2: Japanese Patent Application Laid-Open Publication No. 2004-349504
Patent Document 3: WO2005/117118
Non-Patent Document 1: "IEEE International Electron Devices meeting, TECHNICAL DIGEST," (USA), 2001, pp. 803-806
Non-Patent Document 2: "IEEE International Solid-State Circuits Conference, Digest of Technical Papers," (USA), 2007, pp. 472-473
Non-Patent Document 3: "IEEE International Solid-State Circuits Conference, Digest of Technical Papers," (USA), 2007, pp. 474-475

DISCLOSURE OF THE INVENTION

Problems to be Solved by the Invention

Now, as a result of a study on the technology of the phase change memory as described above made by the present inventors, it has become apparent that it is necessary to take measures for preventing contamination of a manufacturing apparatus due to sublimation of the chalcogenide material upon forming a resistive storage element.

First, a layout of the phase change memory has been studied. FIG. 4A illustrates a circuit configuration diagram of memory cells on a bit-line BL0 in the memory-cell array illustrated in FIG. 3, FIG. 4B illustrates a layout of the memory cells, and FIG. 4C illustrates a cross-section structure of the memory cells. In the layout diagram illustrated in FIG. 4B, AA0, AA1, AA2, . . . are active area patterns forming a drain electrode, a source electrode, and a channel of a select transistor. The active area pattern is divided by two memory cells. For example, the active area pattern AA0 is used for forming the memory cells MC00 and MC10. FGs are poly-silicon patterns forming the word lines WL0, WL1, . . . RLA and RL are resistive storage element patterns. Especially, the pattern RLA is for a storage element in the memory cell MC00 arranged at an end of the bit-line BL0. BC is a bottom contact pattern for connecting an active area and a resistive storage element. TC and TCA are top contact patterns for connecting a resistive storage element and an upper wiring layer (not illustrated). Especially, the pattern TCA is a top contact formed on the resistive storage element in the memory cell MC00 arranged at the end of the bit-line BL0.

The cross-sectional view of FIG. 4C illustrates a structure of a main part for ease of description. 100 denotes a p-type silicon substrate. 101 denotes a word line connected with a gate electrode of a select transistor. 102 denotes an n+ diffusion layer to be a drain electrode and a source electrode of a select transistor. 104 denotes a P-well and 106 denotes an insulator for isolation. 120 and 120A denote resistive storage elements. Especially, 120A denotes a resistive storage element in the memory cell MC00. 131 denotes a bottom contact. 132 and 132A denote top contacts. Especially, 132A denotes a top contact formed on the resistive storage element 120A in the memory cell MC00 arranged at the end of the bit-line BL0.

In such a structure, since a pattern density of the resistive storage elements lowers in the memory cell MC00 arranged at the end of the bit-line BL0, namely, near an outer periphery of the memory-cell array, patterning may be performed to have an area smaller than an original design size in a photolithography process. Further, in a dry etching process performed thereafter, etching in a lateral direction advances too much due to a loading effect caused by the lowering of the pattern density, which may result in reduction of an area of the final resistive storage element. It has been found that, when the area of the storage element becomes relatively small in this manner, a top contact pattern TCA (132A) may protrude from a storage element pattern RLA (120). A cross-section structure regarding a resistive storage element is described in detail with reference to FIG. 5 to consider the problem.

In fact, the resistive storage elements 120 and 120A (RL, RLA) described in FIGS. 4A-4C each includes an interfacial layer 300, a chalcogenide material 301, and a tungsten electrode 302, as illustrated in FIG. 5. Further, the storage element is protected by silicon nitrides 303 and 304. 400 denotes an Interlayer Dielectric film. Top contact holes 132H and 132AH are contact holes in which tungsten forming the top contacts 132 and 132A are buried. These contact holes are formed on the bottom contact 131 using the silicon nitride 304 as an etch-stopper and on the resistive storage element using the silicon nitride 303 as an etch-stopper. In the memory cell MC00, however, the top contact 132AH protrudes from the storage element, so that the silicon nitride 304 formed on a sidewall of the storage element is scraped off. Therefore, burying of tungsten serving as the top contact is performed having the chalcogenide material 301 being exposed using a vacuum CVD (Chemical Vapor Deposition) apparatus. In this process, since a target wafer is heated to a sublimation temperature (about 200° C.) of the chalcogenide material or higher, the CVD apparatus may be contaminated by sublimation of the chalcogenide material. When areas of the storage element patterns RL and RLA are increased such that the top contact pattern TCA (132A) does not protrude in order to avoid this problem, such a problem that an area of the memory-cell array increases newly occurs.

Second, the depth of the dry etching of the above-mentioned top contact hole has been studied. FIG. 6 illustrates a cross-section structure obtained when the pattern of the resistive storage element (120, RL) in the memory cell MC00 has been processed to a desired size. A point to pay attention in FIG. 6 is that the Interlayer Dielectric film 400 becomes thin in the memory cell MC00 arranged at the end of the bit-line BL0, namely, at an outer periphery of the memory-cell array due to CMP (Chemical Mechanical Polishing). As a result, a top contact hole 132HB may break through the silicon nitrides 304 and 303 and the tungsten layer 302 to reach the chalcogenide 301. As previously described in FIG. 5, tungsten configuring the top contact is deposited on the exposed chalcogenide material 301 even in such a situation. Thereby, when the target wafer is heated in this process, the inside of the CVD apparatus may be contaminated due to sublimation of the chalcogenide material.

A subject of the present invention is to solve these problems. That is, a preferred aim of the present invention is to achieve a phase change memory having a small area without exposure of a chalcogenide material due to unevenness in a memory array processing.

The above and other preferred aims and novel characteristics of the present invention will be apparent from the description of the present specification and the accompanying drawings.

Means for Solving the Problems

The typical ones of the inventions disclosed in the present application will be briefly described as follows.

That is, in a semiconductor device including a phase change memory, buffer cells are arranged between a sense amplifier and a memory-cell array and between a word driver and the memory cell array. The buffer cell is configured by a resistive storage element and a select transistor same with those in a memory cell. The resistive storage element in the memory cell is connected to a bit-line via a contact formed on the resistive storage element. On the other hand, in the buffer cell, no contact is formed on the resistive storage element and when a contact within the memory cell is processed, the resistive storage element is maintained in a state of being covered with an insulating material. Exposure or sublimation of a chalcogenide film used in the resistive storage element is avoided by such a processing method.

Effects of the Invention

According to the present invention, a phase change memory can be manufactured without resulting in contamination of a manufacturing apparatus.

BRIEF DESCRIPTIONS OF THE DRAWINGS

Figure 22:
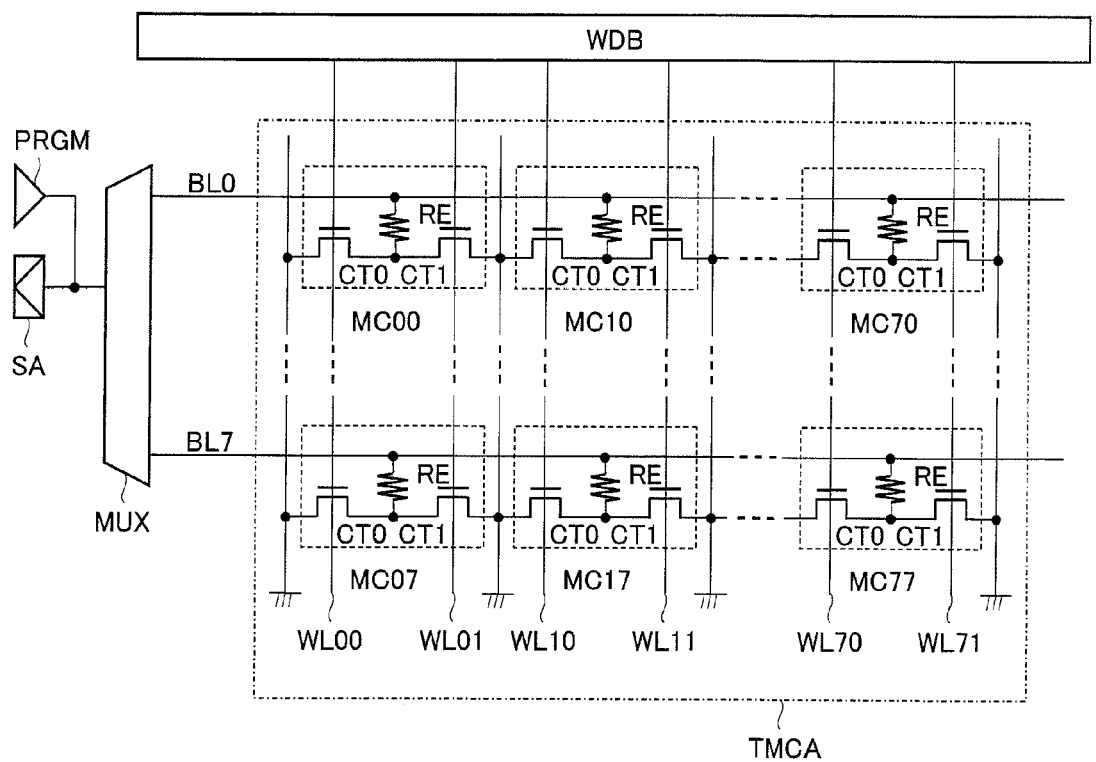
FIG. 22 is a diagram illustrating an example of a circuit configuration of a phase change memory included in a semiconductor device of an eighth embodiment.
Figure 24:
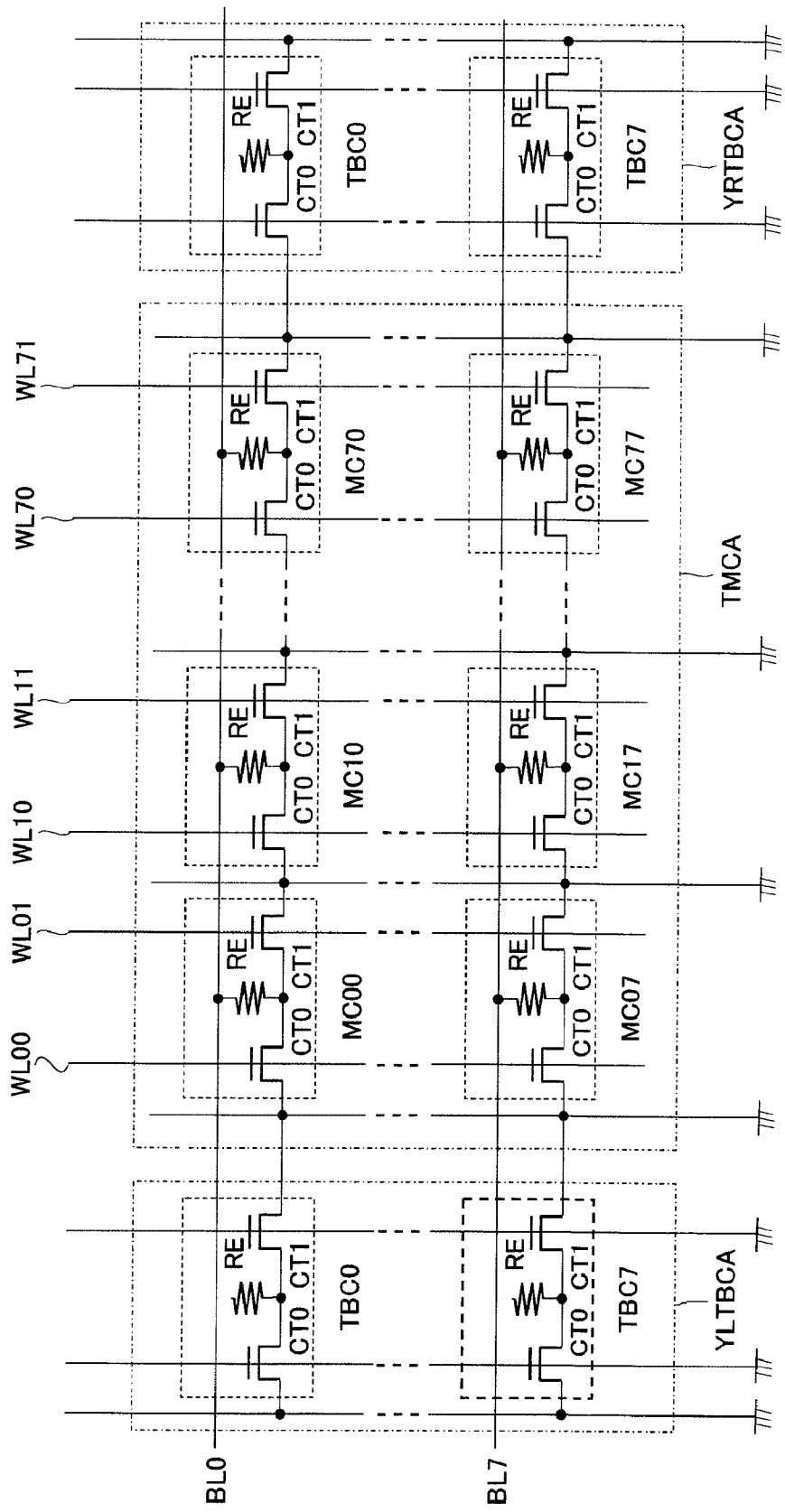
Figure 25A:
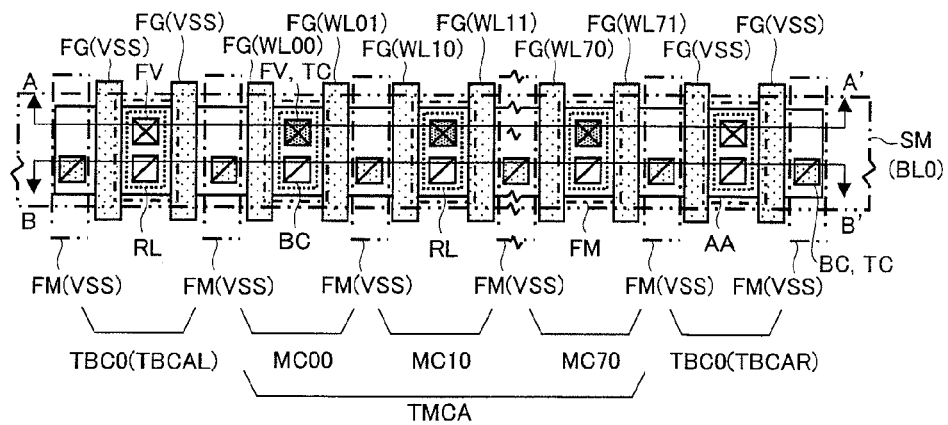
Figure 25B:
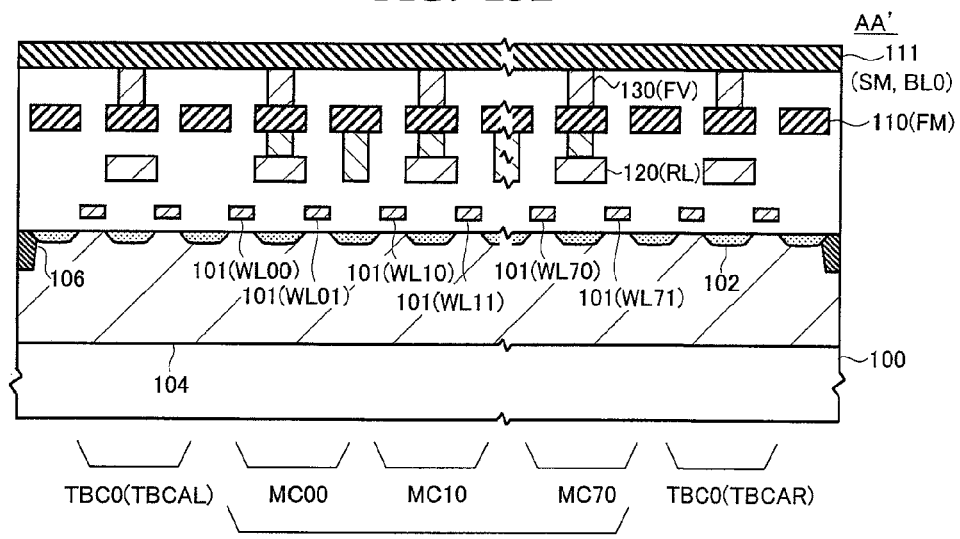
Figure 25C:
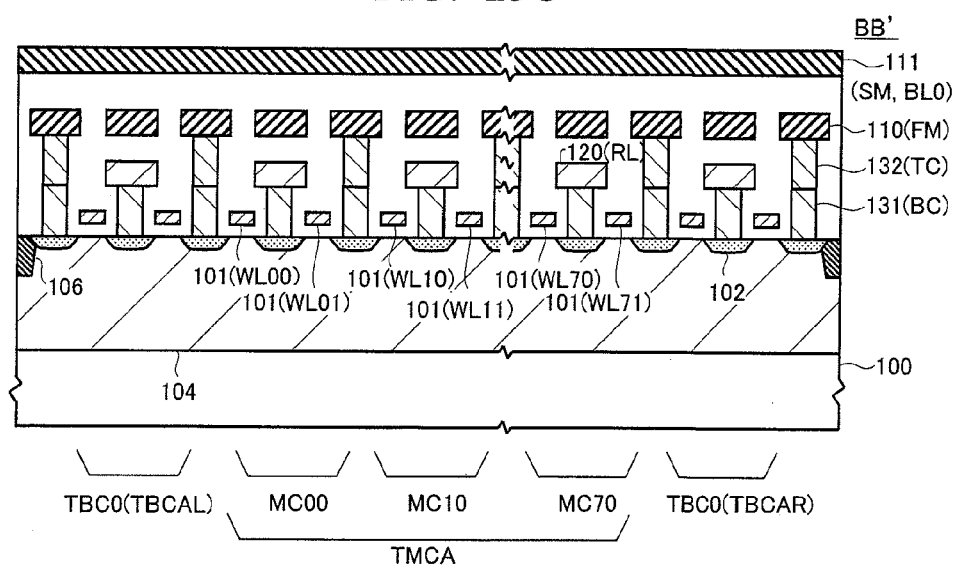
Figure 26:
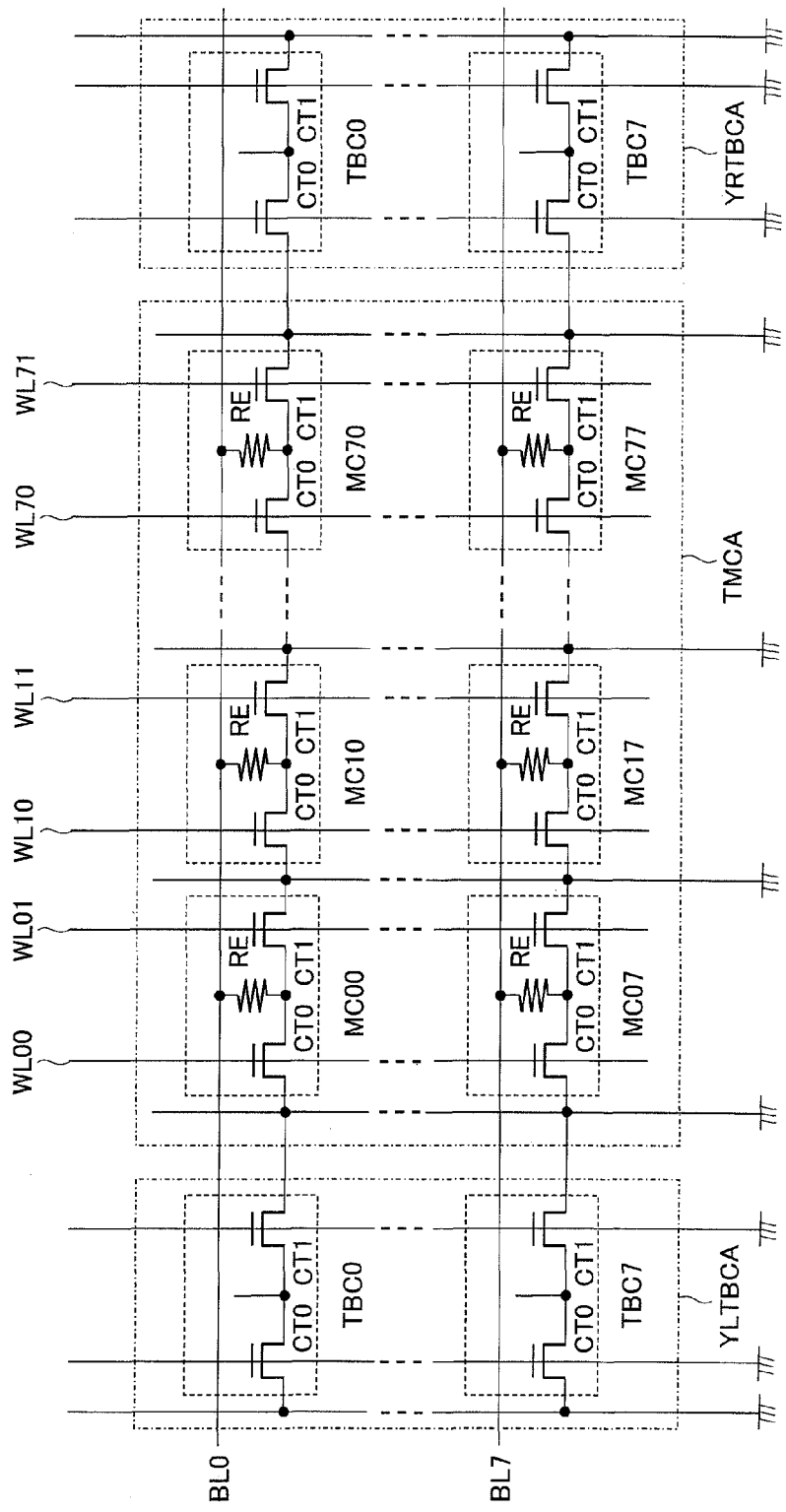
Figure 27A:
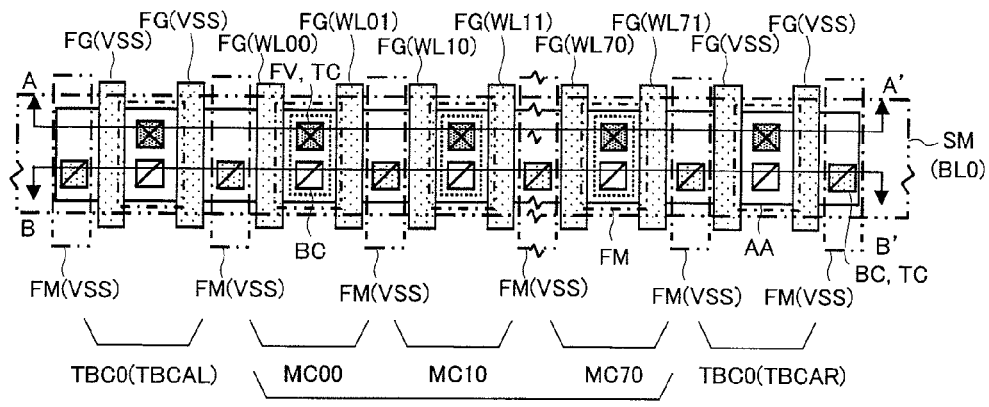
Figure 27B:
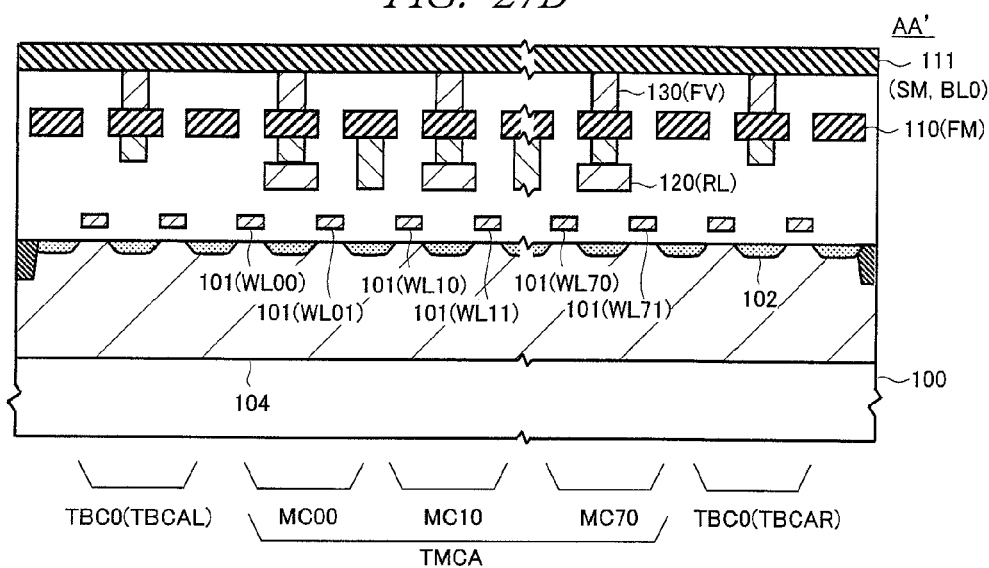
Figure 27C:
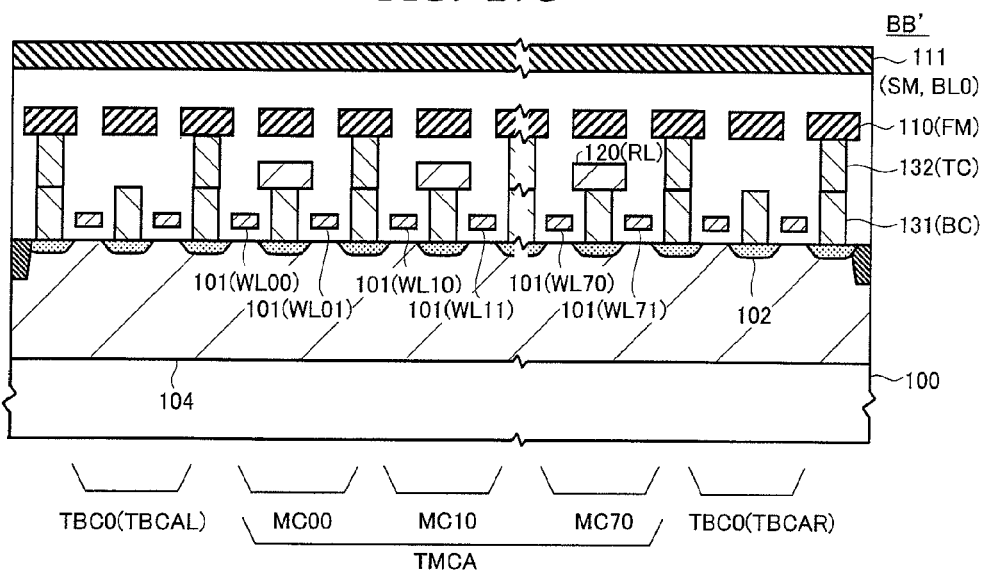

FIGS. 23A-23 F are diagrams illustrating examples of timing diagrams of set operations of the phase change memory illustrated in FIG. 22;

FIG. 24 is a diagram illustrating an example of a circuit configuration of a phase change memory included in a semiconductor device of a ninth embodiment;

FIGS. 25A-25C are diagrams illustrating another example of a layout and a cross-section structure of the phase change memory illustrated in FIG. 24;

FIG. 26 is a diagram illustrating an example of a circuit configuration of a phase change memory included in a semiconductor device of a tenth embodiment; and FIGS. 27A-27C are diagrams illustrating another example of a layout and a cross-section structure of the phase change memory illustrated in FIG. 26.

BEST MODE FOR CARRYING OUT THE INVENTION

Hereinafter, embodiments of the present invention will be described in detail with reference to the accompanying drawings. Note that components having the same function are denoted by the same reference symbols throughout the drawings for describing the embodiment, and the repetitive description thereof will be omitted. Further, a circuit device configuring each block in the embodiments is not limited to a specific one, but it is typically formed on one semiconductor substrate such as single crystal silicon by a technology of integrated circuit for, for example, a known CMOS (complementary MOS transistor). Further, a chalcogenide material or the like exhibiting phase change is formed in a hybrid manner with a manufacturing technology of an integrated circuit.

First Embodiment

Figure 3:
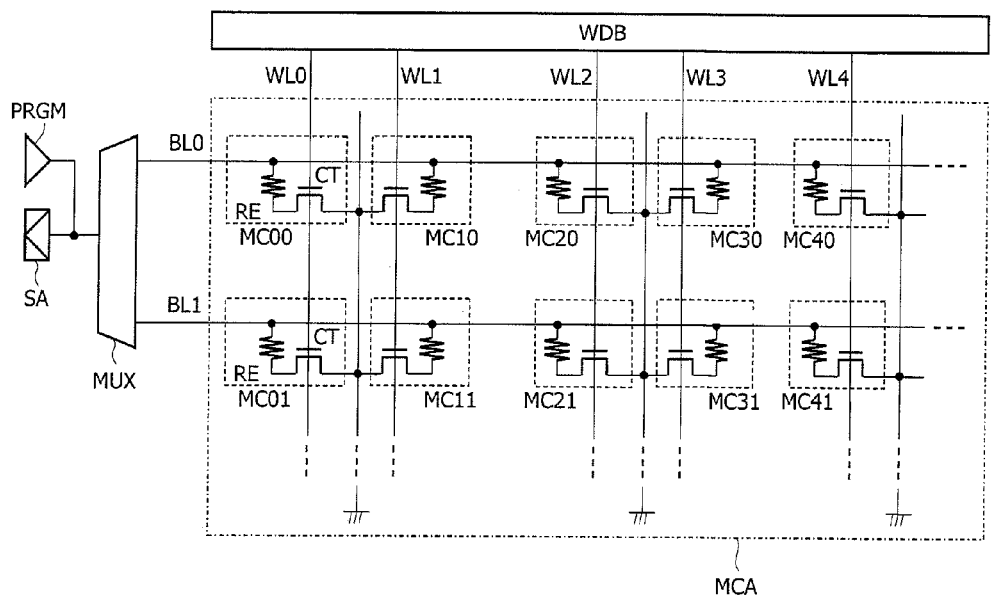
FIG. 3 is a diagram illustrating a configuration example of a phase change memory.
Figure 7:
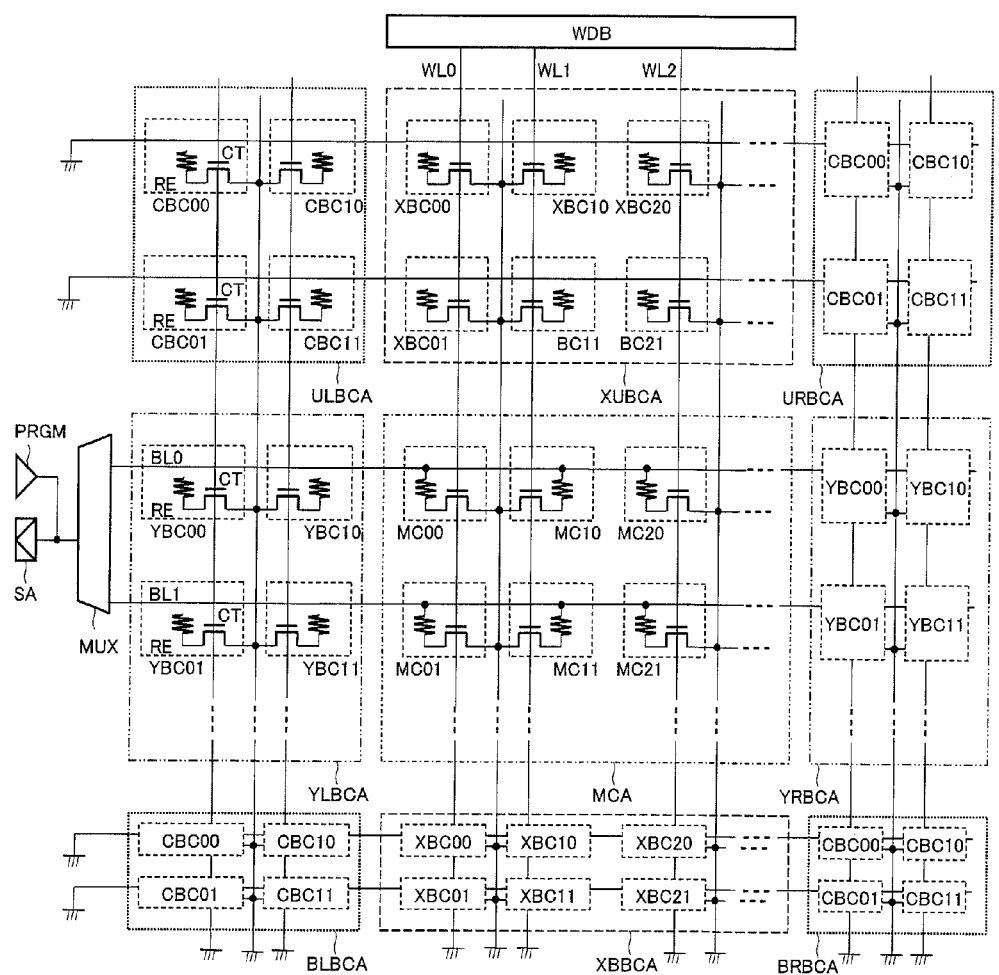
FIG. 7 is a diagram illustrating an example of a circuit configuration of the phase change memory of FIGS. 1A-1B.

FIG. 7 illustrates a configuration example of a main block of a phase change memory according to a first embodiment of the present invention. That is, the phase change memory includes a memory-cell array MCA and eight buffer-cell arrays YLBCA, YRBCA, XUBCA, XBBCA, ULBCA, URBCA, BLBCA, and BRBCA arranged around the memory-cell array MCA in addition to a multiplexer MUX, a block of word drivers WDB, a program circuit PRGM, and a sense amplifier SA. A configuration excepting the eight buffer-cell arrays is the same as the configuration illustrated in FIG. 3. A feature of the phase change memory lies in that a cell including a resistive storage element RE disconnected from a bit-line BL0 and a select transistor CT, for example, such as a buffer cell YBC00 in the buffer-cell array YLBCA is arranged around the memory-cell array MCA. A configuration of the buffer-cell array will be described below in detail.

The buffer-cell array YLBCA (a second plurality of buffer cells) includes buffer cells YBC00, YBC10, . . . arranged at respective intersection points of two ground voltage supply lines (second voltage supply lines) and bit lines BL0, BL1, . . . , and it is arranged between the multiplexer MUX and the memory-cell array MCA. The resistive storage element RE and the select transistor CT configuring each of the buffer cells have the same structure as that of the memory cell in the memory-cell array MCA. The buffer-cell array YRBCA has the same configuration as that of the buffer-cell array YLBCA and it is disposed at the other end of each bit-line so as to be paired with the buffer-cell array YLBCA.

The buffer-cell array XUBCA (a first plurality of buffer cells) includes buffer cells XBC00, XBC10, . . . arranged at respective intersection points of two ground voltage supply lines (first voltage supply lines) and word lines WL0, WL1, . . . , and it is arranged between the block of word drivers WDB and the memory-cell array MCA. The two ground voltage supply lines correspond to bit-lines in the memory-cell array MCA, and the resistive storage element in each buffer cell is disconnected from the ground voltage supply lines. The buffer-cell array XBBCA has the same configuration as that of the buffer-cell array XUBCA, and it is disposed at the other end of the each word line so as to be paired with the buffer-cell array XUBCA.

Each of the buffer-cell arrays ULBCA, URBCA, BLBCA, and BRBCA includes buffer cells CBC00, CBC10, CBC01, and CBC11 arranged at intersection points of two ground voltage supply lines parallel to the word lines and two ground voltage supply lines parallel to the bit-lines. These buffer-cell arrays are arranged around the memory-cell array MCA together with the other buffer-cell arrays YLBCA, YRBCA, XUBCA, and XBBCA.

Figure 1A:
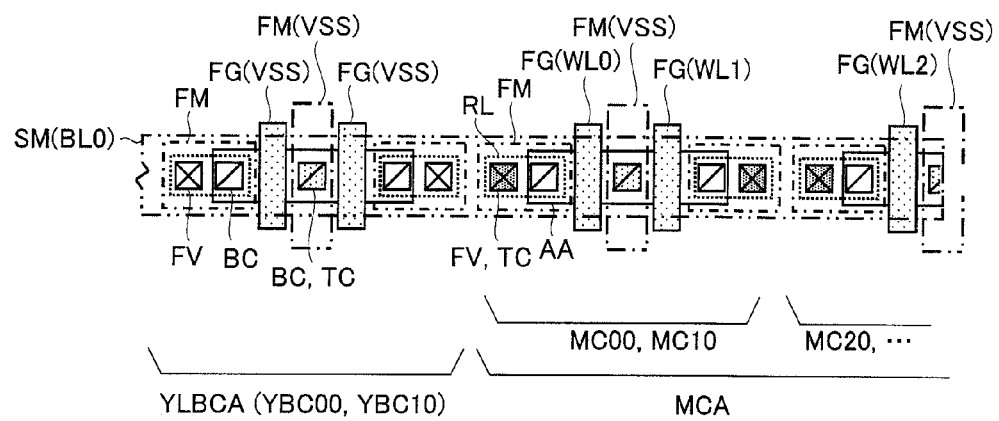
FIGS. 1A-1B are diagrams illustrating an example of a layout and a cross-section structure of a phase change memory included in a semiconductor device of a first embodiment of the present invention.
Figure 1B:
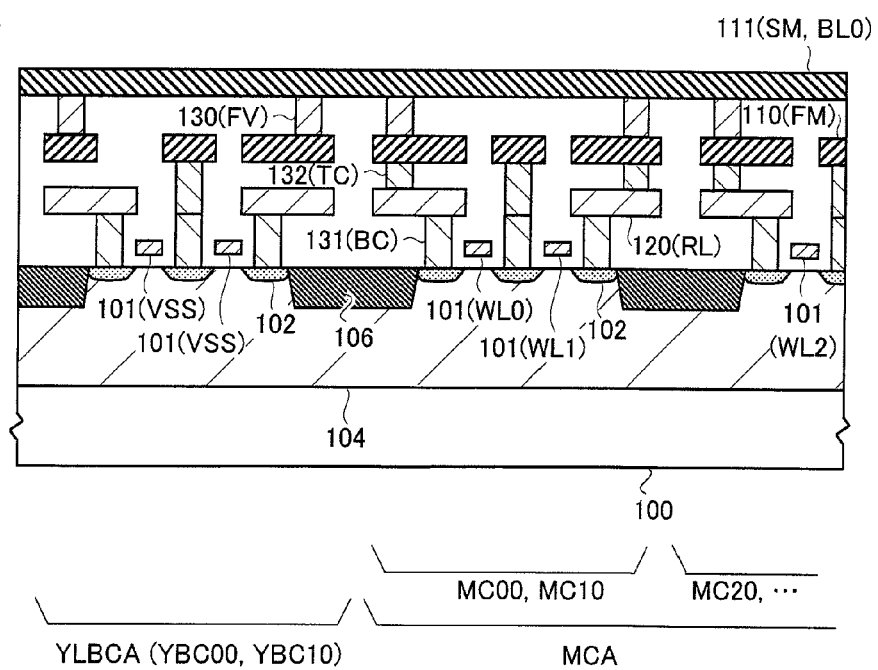
Figure 4A:
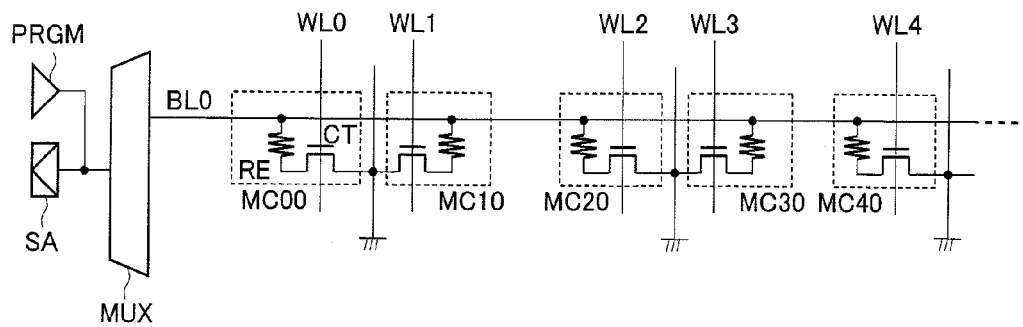
FIGS. 4A-4C are diagrams illustrating an example of a layout and a cross-section structure of the phase change memory illustrated in FIG. 3.
Figure 4B:
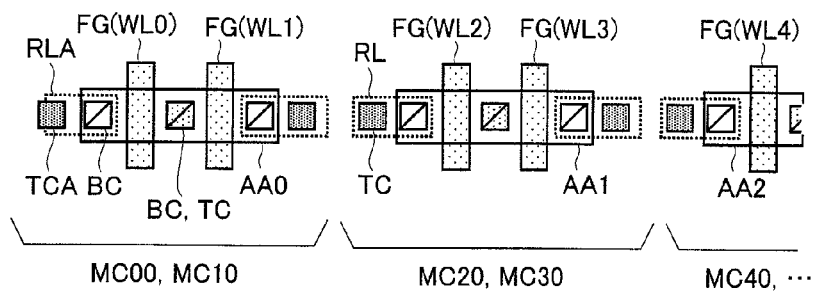
Figure 4C:
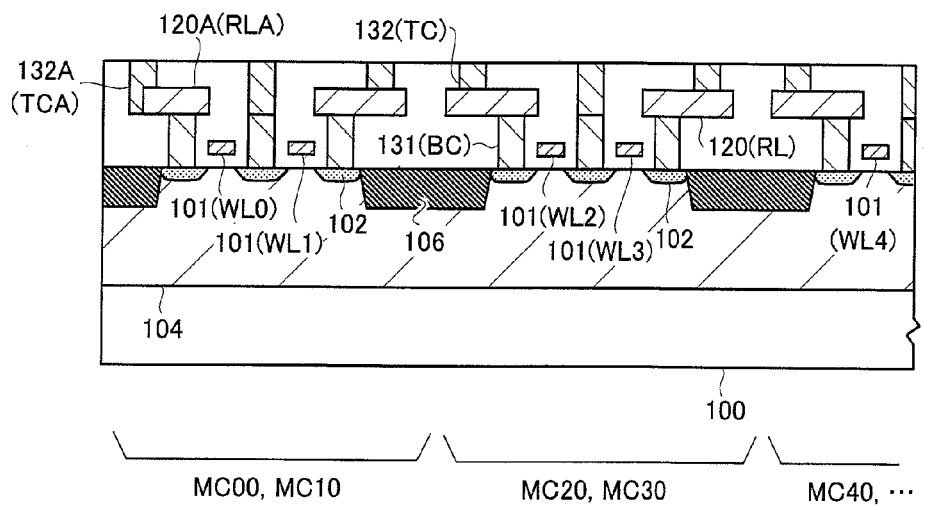
Figure 5:
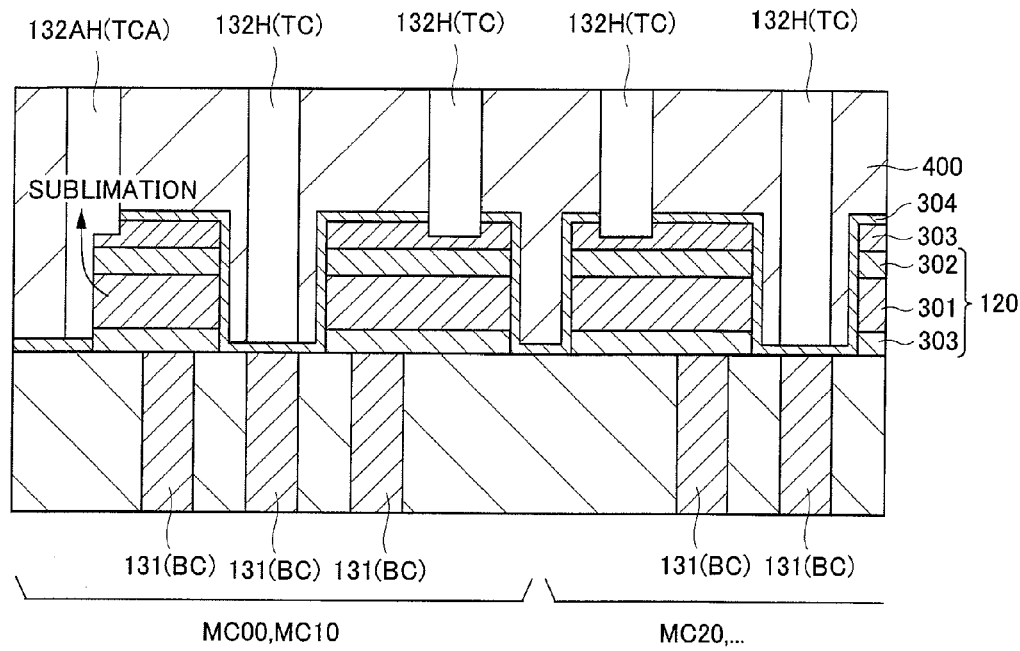
FIG. 5 is a diagram illustrating an example of a cross-section structure of the phase change memory illustrated in FIGS. 4A-4C in detail.
Figure 6:
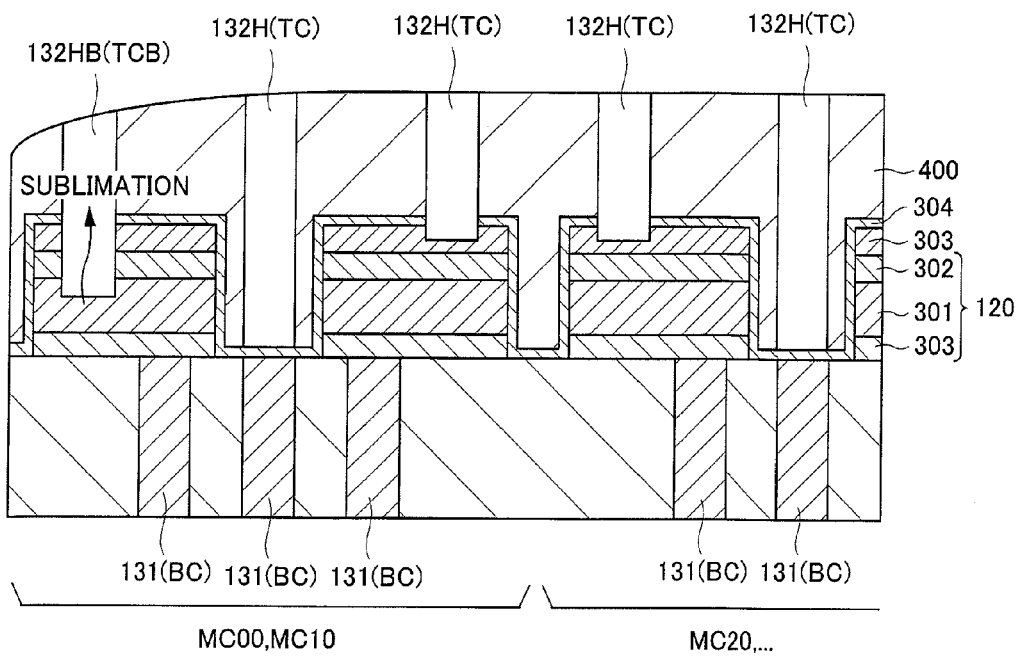
FIG. 6 is a diagram illustrating another example of a cross-section structure of the phase change memory illustrated in FIGS. 4A-4C in detail.

FIG. 1A illustrates a layout of the buffer-cell array YLBCA and the memory-cell array MCA on the bit-line BL0 of the phase change memory illustrated in FIG. 7, and FIG. 1B illustrates a cross-section structure of the same. As compared with FIG. 4, a pattern FM of a first metal layer 110, a pattern SM of a second metal layer 111, and a pattern FV of a first via 130 are newly added. The first metal layer 110 is used as the ground voltage supply line. The second metal layer 111 is used as the bit-line BL0. The first via 130 is disposed on the same axis as the axis of the top contact (TC), and it is used for connecting the abovementioned first metal layer 110 and second metal layer 111 to each other. In the buffer cells YBC00 and YBC10, the connection between the resistive storage element (RL, 120) and the bit-line (SM, 111) is cut by removing the top contact (TC, 132) on the resistive storage element (RL, 120), as illustrated in the circuit diagram in FIG. 7.

Figure 8:
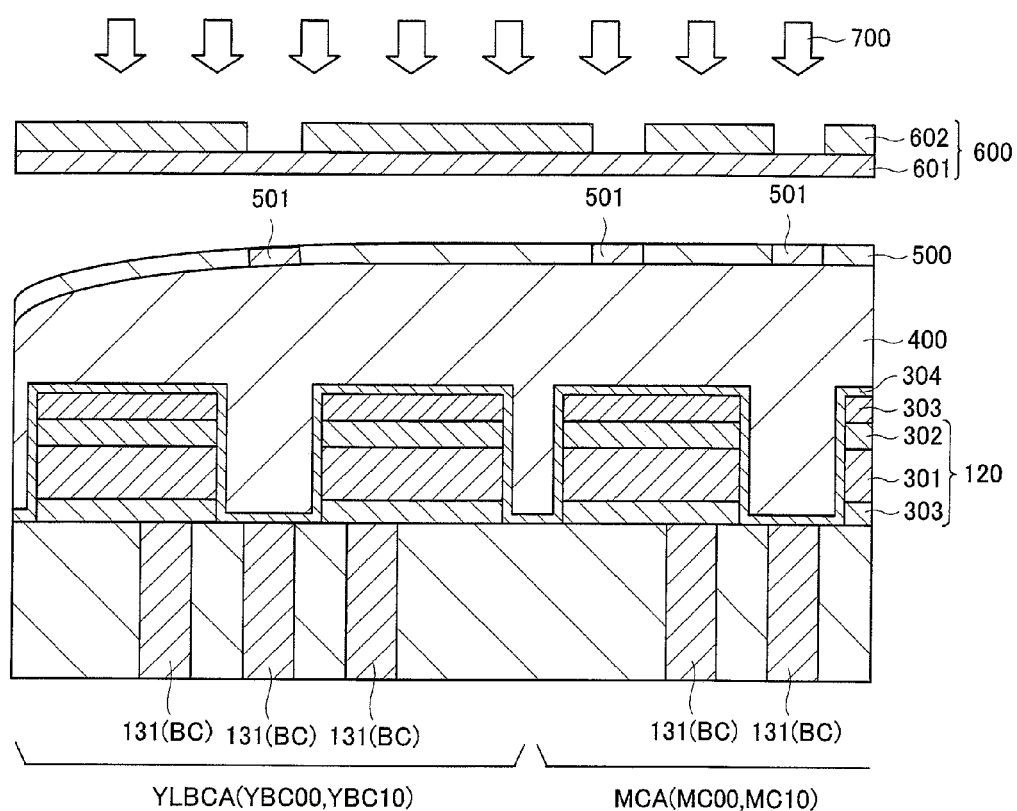
FIG. 8 is a diagram illustrating an example of a photolithography process for the phase change memory illustrated in FIGS. 1A-1B in detail.
Figure 9:
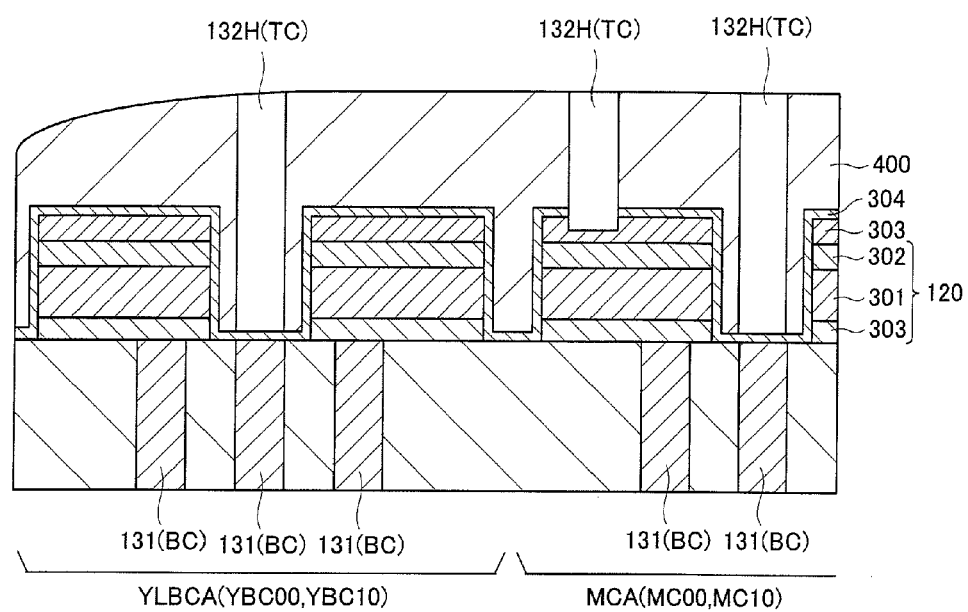
FIG. 9 is a diagram illustrating an example of a cross-section structure of the phase change memory illustrated in FIGS. 1A-1B in detail.

FIG. 8 illustrates an example of a photolithography process as a processing method for forming the top contact. A resist 500 being applied on an upper portion of an Interlayer Dielectric film 400 is exposed using a photomask 600 having a photo-shielding film 602 being removed in the same pattern as that of the top contact on a glass plate 601. Next, a resist area 501 being exposed by exposure light 700 is removed by using a developer. Further, when an etching processing is performed using a resist on the remaining portions which have not been exposed as a mask, top contact holes 132H are formed at desired positions, as illustrated in FIG. 9.

By adopting such a structure as described above, the sublimation problem of chalcogenide and the contamination problem of the manufacturing apparatus in the processing of the phase change memory can be avoided. That is, the resistive storage element in the buffer cells YBC00 and YBC10 are maintained in a state of being protected by the Interlayer Dielectric film 400 at a formation time of the top contact holes 132H, as illustrated in FIG. 8. Therefore, there is not a concern that exposure or sublimation of the chalcogenide film 301 occurs even when the pattern of the resistive storage element is small or the Interlayer Dielectric film on the buffer-cell array YLBCA is thin. Accordingly, it becomes possible to prevent contamination of the manufacturing apparatus and production throughput is improved. Furthermore, in the memory-cell array MCA, since the area of the resistive storage element pattern RL can be suppressed, a phase change memory having a small area can be formed. Moreover, since the resistive storage elements RE and the select transistors CT are arranged regularly, shape variation in the memory-cell array MCA can be suppressed, so that a phase change memory having even electric characteristics can be achieved.

Second Embodiment

Figure 10:
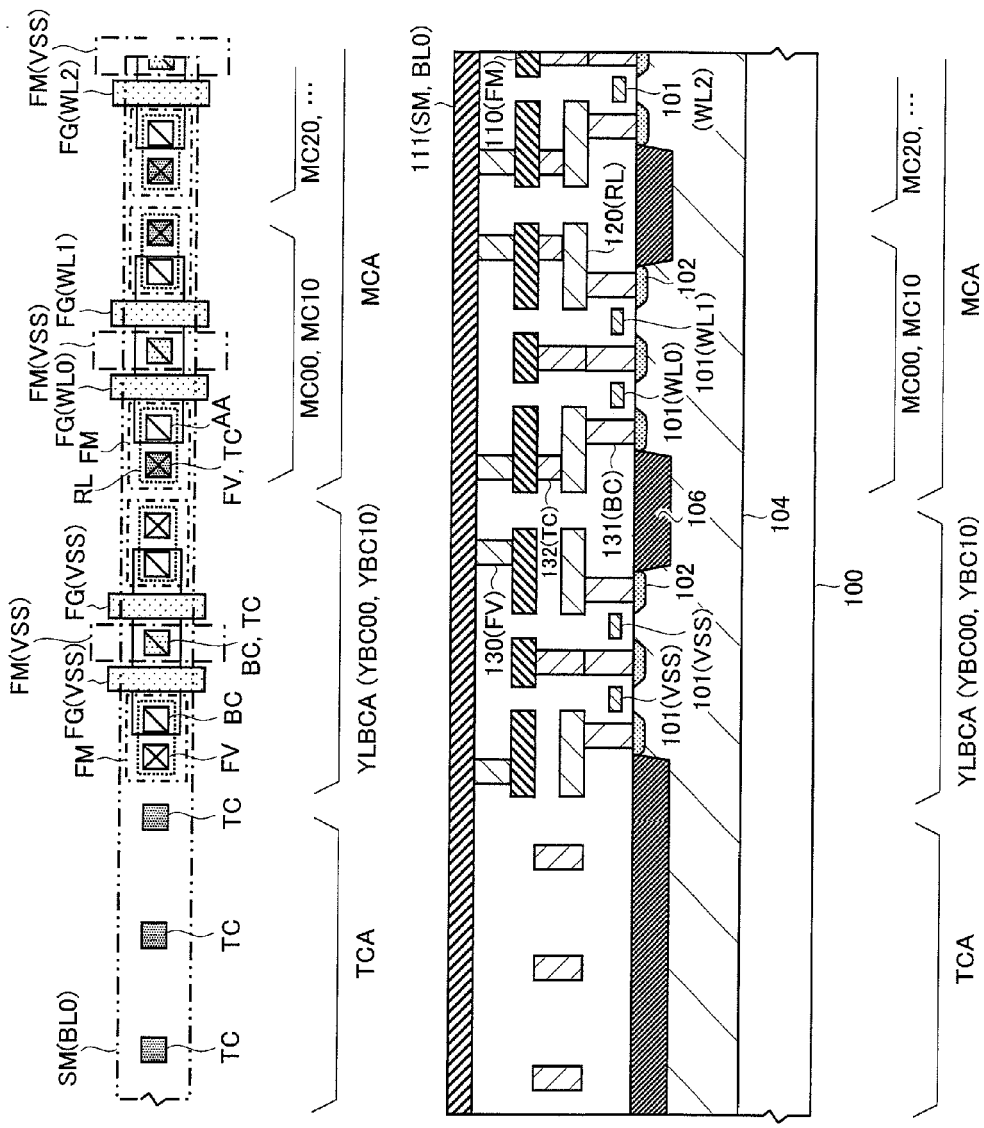
FIGS. 10A-10B are diagrams illustrating an example of a layout and a cross-section structure of a phase change memory included in a semiconductor device of a second embodiment of the present invention.

FIGS. 10A and 10B illustrate another example of a layout and a cross-section structure of a phase change memory according to a second embodiment of the present invention. A difference of this embodiment from the first embodiment illustrated in FIGS. 1A-1B in layout lies in that the top contacts TC are further arranged at the end of the bit-line BL0, namely, outside the buffer-cell array YLBCA. The top contacts are formed at the same positions as the case of arranging the memory cells in this area.

With such a configuration, the top contacts of the memory cell (here, the memory cell MC00) positioned at the outermost periphery in the memory-cell array MCA are positioned inside the top contacts arranged in matrix. Thereby, the top contacts of the memory cell MC00 are formed in an area where the density of the top contacts is substantially constant. Accordingly, shape variation in the memory-cell array MCA is further suppressed, so that a phase change memory having further even electric characteristics can be achieved.

Third Embodiment

In a third embodiment of the present invention, a configuration example of a main block of a phase change memory different from the previously-described invention will be described. A feature of this invention lies in a configuration in which the resistive storage element is removed from the buffer cell. The feature will be described below with reference to FIG. 11 to FIG. 13.

Figure 11:
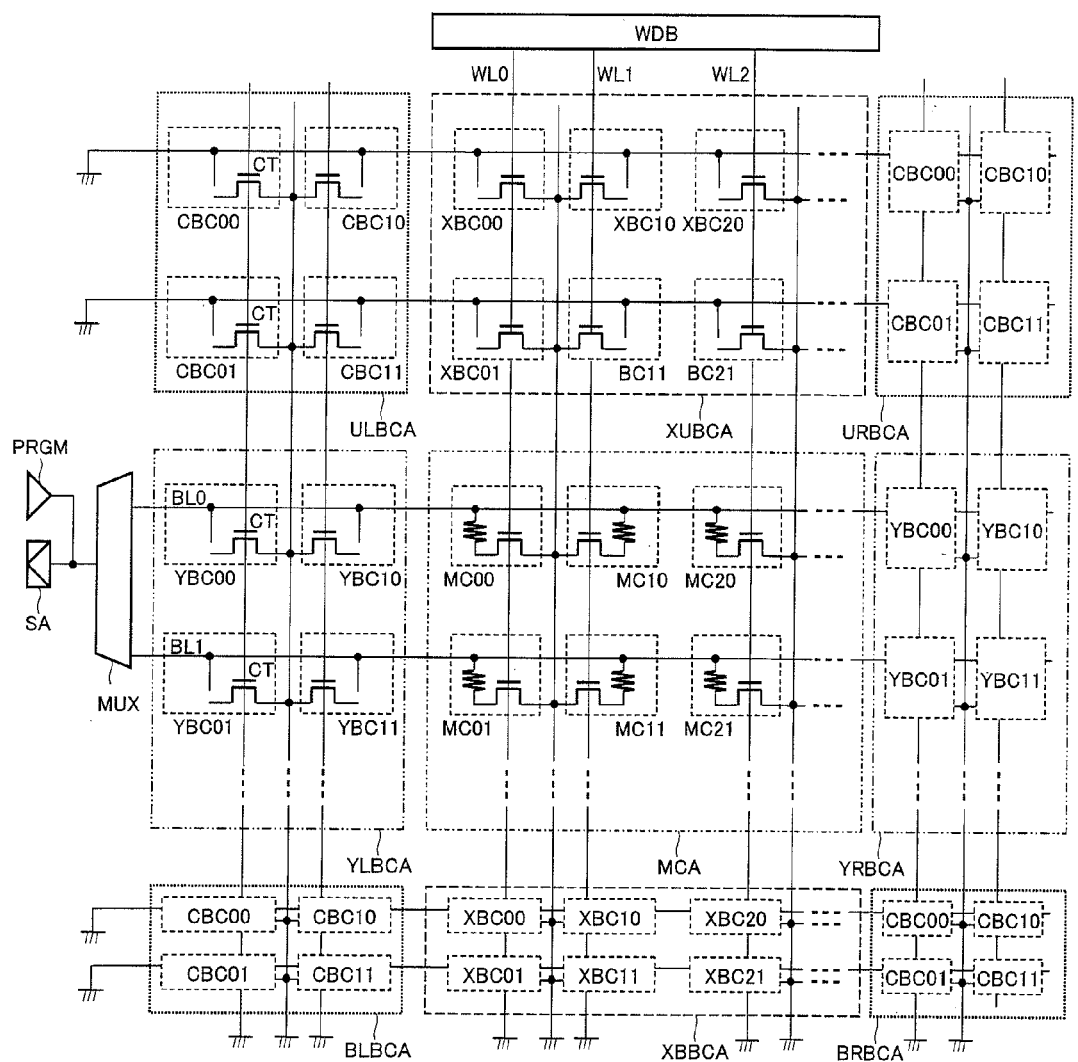
FIG. 11 is a diagram illustrating an example of a circuit configuration of a phase change memory included in a semiconductor device of a third embodiment.

FIG. 11 illustrates a configuration example of a main block of a phase change memory according to the third embodiment. Eight buffer-cell arrays YLBCA, YRBCA, XUBCA, XBBCA, ULBCA, URBCA, BLBCA, and BRBCA are arranged around a memory-cell array MCA in the same manner as FIG. 7. These buffer-cell arrays include buffer cells having a select transistor CT. A source electrode and a gate electrode of the select transistor CT are connected to ground voltage supply lines, respectively.

Figure 12A:
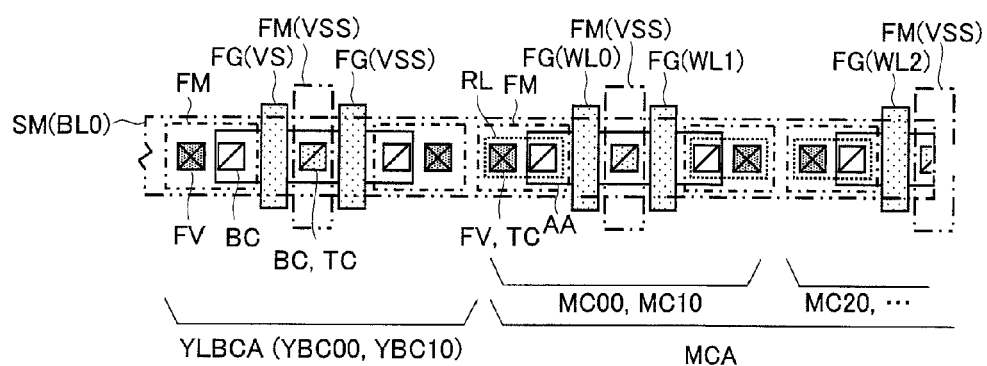
FIGS. 12A-12B are diagrams illustrating an example of a layout and a cross-section structure of the phase change memory illustrated in FIG. 11.
Figure 12B:
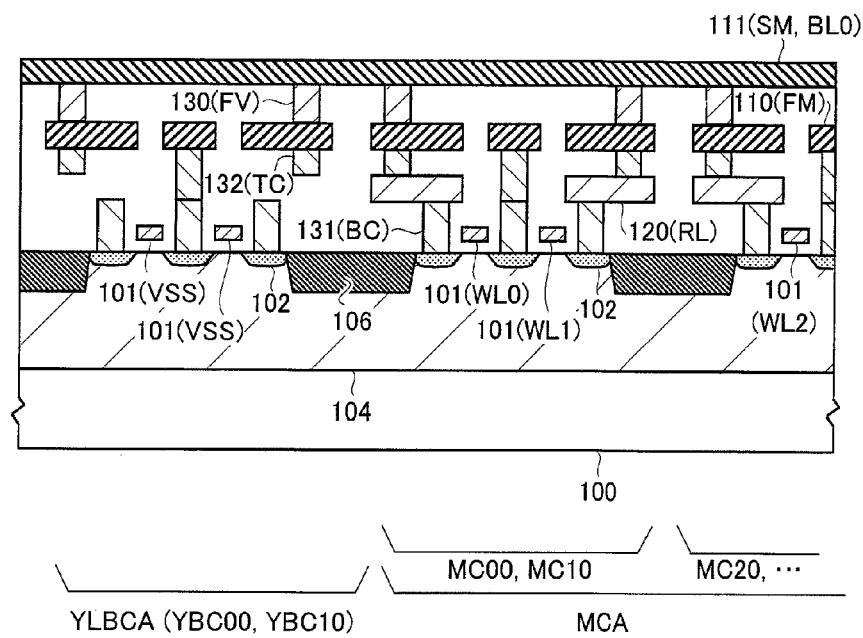

FIG. 12A illustrates a layout of the buffer-cell array YLBCA and the memory-cell array MCA on the bit-line BL0 of the phase change memory illustrated in FIG. 11, and FIG. 12B illustrates a cross-section structure of the same. As compared with FIG. 1, the present embodiment is different from FIGS. 1A-1B in that the resistive storage element (RL, 120) is removed in the buffer cells YBC00 and YBC10. Instead, the top contact (TC, 132) on the resistive storage element (RL, 120) is formed like the memory cell MC00 and the like. The top contacts are formed using a photolithography process such as illustrated in FIG. 8 of the first embodiment.

Figure 13:
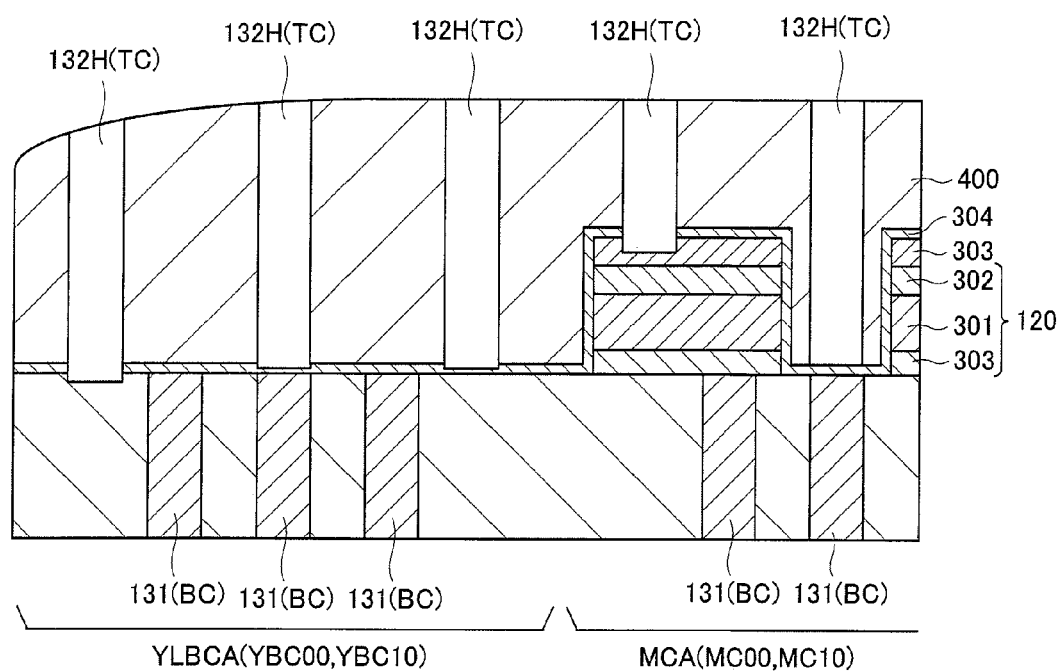
FIG. 13 is a diagram illustrating an example of a cross-section structure of the phase change memory illustrated in FIGS. 12A-12B in detail.

By adopting such a structure, such an effect as avoidance of the sublimation problem of chalcogenide and the contamination problem of the manufacturing apparatus in the processing of the phase change memory can be obtained like the previous embodiments. That is, top contact holes 132H are formed at positions at which the resistive storage element 120 does not exist in the buffer cells YBC00 and YBC10, as illustrated in FIG. 13. Therefore, even when misalignment occurs between the resistive storage element 120 and the top contact hole 132H or even when an Interlayer Dielectric film on the buffer-cell array YLBCA is thin, there is not a concern about exposure or sublimation of the chalcogenide film 301. Thereby, it becomes possible to prevent contamination of the manufacturing apparatus so that the production throughput is improved. Further, since the top contacts are arranged regularly, shape variation in the memory-cell array MCA can be suppressed, so that a phase change memory having even electric characteristics can be achieved.

Fourth Embodiment

Figure 14A:
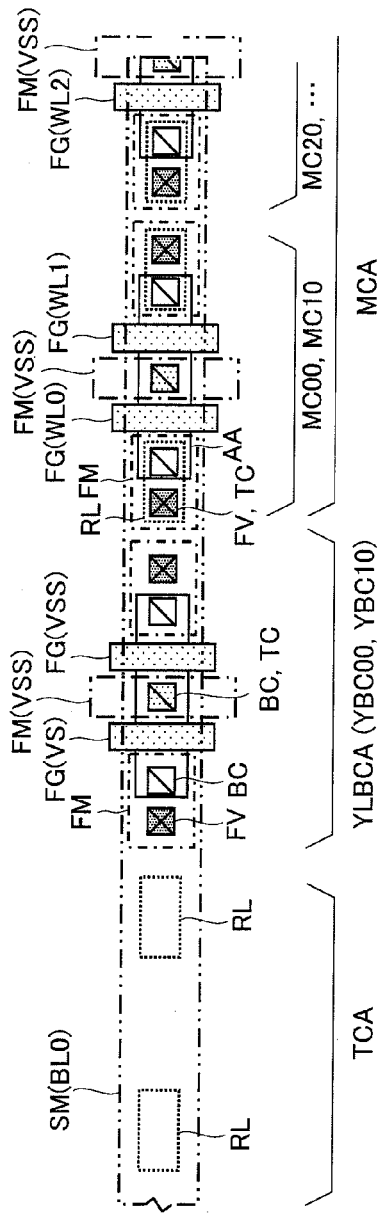
FIGS. 14A-14B are diagrams illustrating an example of a layout and a cross-section structure of a phase change memory included in a semiconductor device of a fourth embodiment of the present invention.
Figure 14B:
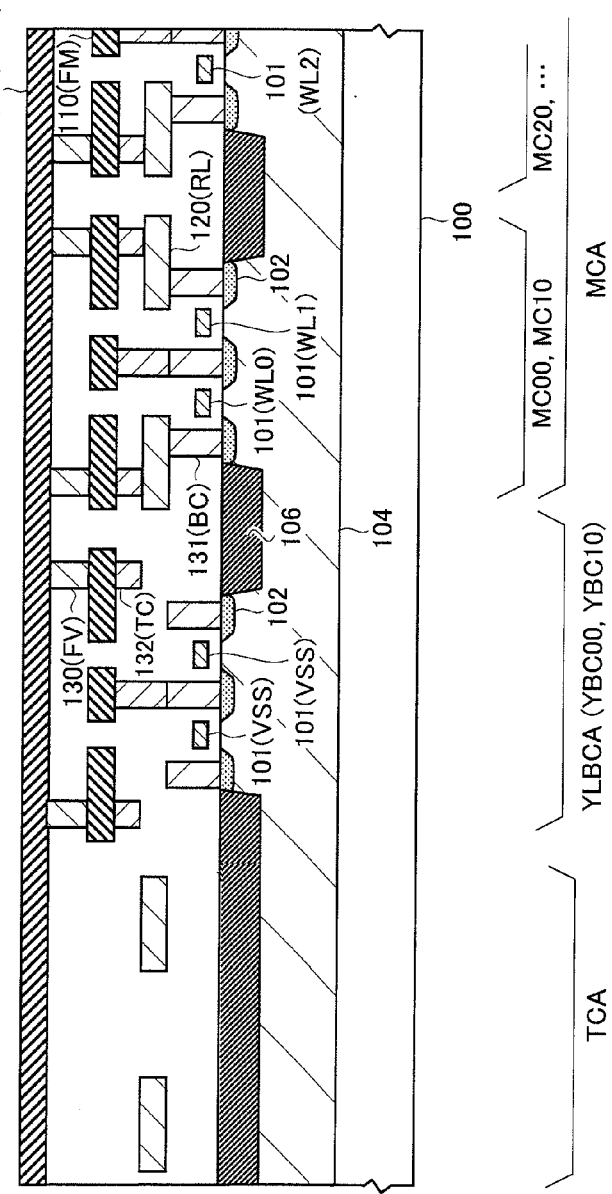

FIGS. 14A and 14B illustrate another example of a layout and a cross-section structure of a phase change memory according to a fourth embodiment of the present invention. A difference of this embodiment from the third embodiment illustrated in FIGS. 12A-12B in layout lies in that the resistive storage elements RL are further arranged at the end of the bit-line BL0, namely, outside the buffer-cell array YLBCA. The resistive storage elements are formed at the same positions as the case of arranging the memory cells in this area.

With such a configuration, the resistive storage elements RL of the memory cell (here, the memory cell MC00) positioned at the outermost periphery in the memory-cell array MCA are positioned inside the resistive storage elements RL arranged in matrix. Therefore, the resistive storage elements RL of the memory cell MC00 are formed in an area where the density of the resistive storage elements RL is substantially constant. Accordingly, shape variation in the memory-cell array MCA is further suppressed, so that a phase change memory having further even electric characteristics can be achieved.

Fifth Embodiment

Since a programming operation of storage information is performed in the phase change memory by Joule heat generated in the resistive storage element, it is important to cause a large current to flow in a memory cell while suppressing the wire resistance as much as possible to reduce a voltage drop in the wiring resistance. In a fifth embodiment of the present invention, means for wiring ground voltage supply lines in a grid-like manner is provided in order to suppress the wiring resistance on the side of the source of a memory cell. That is, a configuration example of a source shunt cell will be described.

Figure 15:
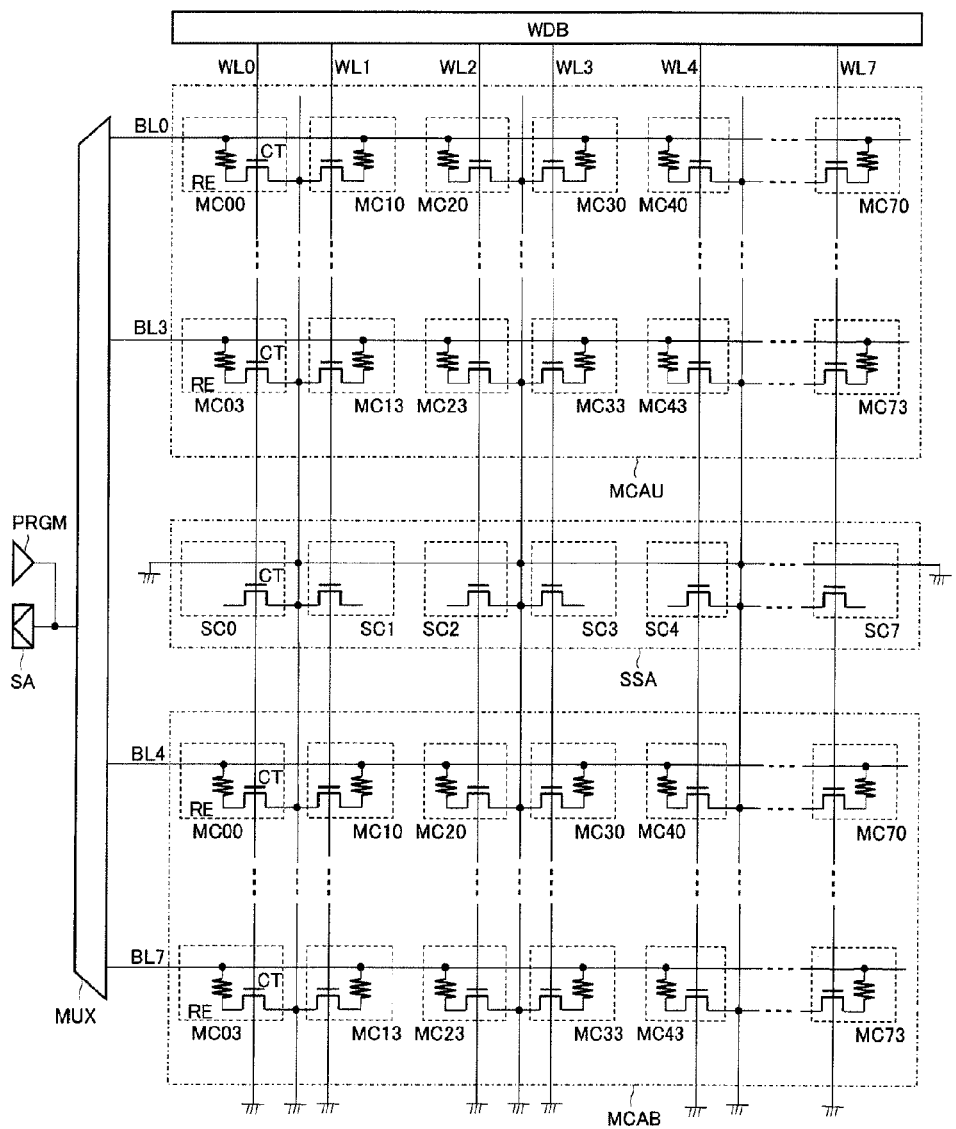
FIG. 15 is a diagram illustrating an example of a circuit configuration of a phase change memory included in a semiconductor device of a fifth embodiment.

FIG. 15 illustrates a diagram of a main block of a phase change memory according to the present invention. In FIG. 15, a configuration example where the memory-cell array MCA is divided into two memory-cell arrays MCAU and MCAB and a source shunt cell array SSA is disposed therebetween is illustrated for ease of explanation. The memory cell array MCAU includes memory cells MC00, MC10, . . . , MC70 arranged at respective intersection points of word lines WL0 to WL7 and bit-lines BL0 to BL3 in an array of 8 rows and 4 columns. In the same manner, the memory cell array MCAB includes memory cells MC00, MC10, . . . , MC70 arranged at respective intersection points of the word lines WL0 to WL7 and bit-lines BL4 to BL7 in an array of 8 rows and 4 columns. The source shunt cell array SSA includes eight source shunt cells SC0 to SC7 arranged at respective intersection points of the word lines WL0 to WL7 and a ground voltage supply line. Each of the source shunt cells includes a select transistor CT similar to that in the memory cell. Incidentally, the number of illustrated bit-lines or word lines is eight for ease of description, but the number is not limited to this.

Figure 16A:
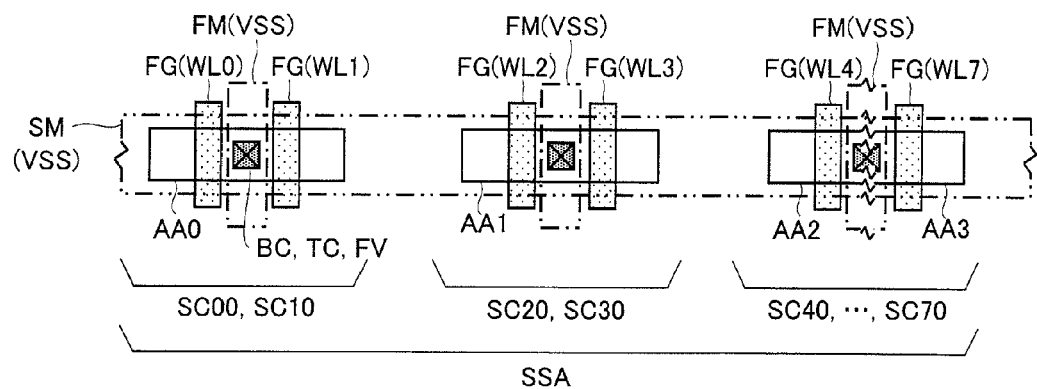
FIGS. 16A-16B are diagrams illustrating an example of a layout and a cross-section structure of the phase change memory illustrated in FIG. 15.
Figure 16B:
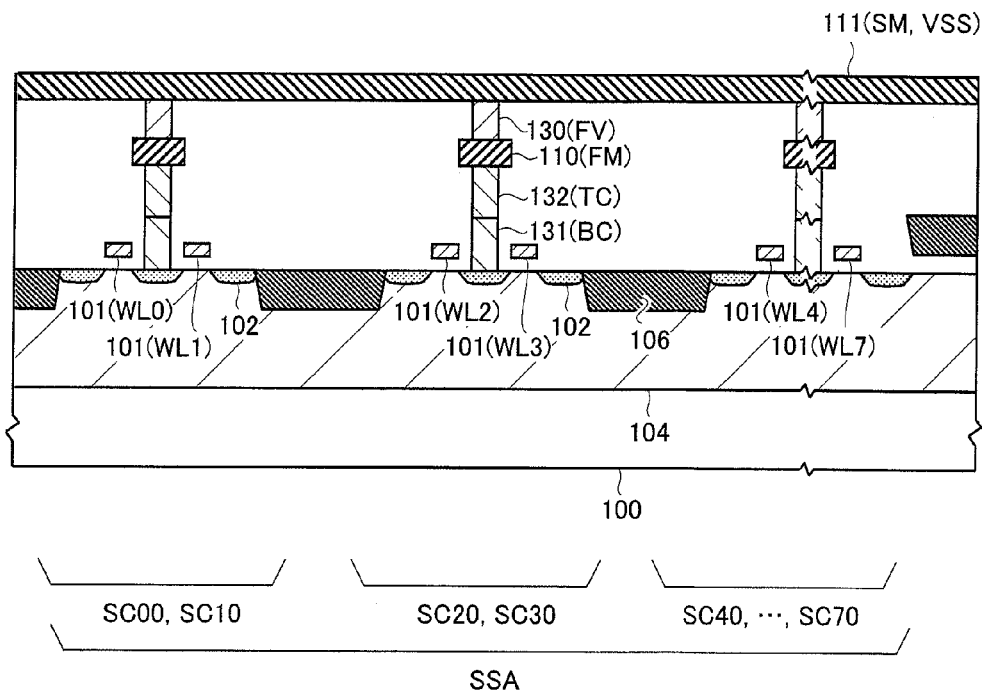

FIG. 16A illustrates a layout of the source shunt cell array SSA of the phase change memory illustrated in FIG. 15 and FIG. 16B illustrates a cross-section structure thereof. As compared with FIG. 1, the present embodiment is different in that the resistive storage element (RL, 120) is removed from the memory cell. Further, a first metal layer (FM) and a first via (FV, 130) are further formed between a bottom contact (BC, 131) and a top contact (TC, 132) which are formed on an n+ diffusion layer (102) so as to be shared by two select transistors and a second metal layer (SM, VSS) arranged in parallel with a bit-line.

By adopting such a structure, it is made possible to arrange ground voltage supply lines in a grid manner in a memory array using the first metal layer FM and the second metal layer SM, so that the wiring resistance on the source side can be reduced. By configuring the source shunt cell to have a select transistor same as that in the memory cell, arrangement of the select transistors becomes regular, so that shape variation in the memory cell can be suppressed. Thereby, even when a source shunt cell is arranged within a memory array, electric characteristic variation of the memory cell can be suppressed, so that a phase change memory operating stably can be achieved.

Sixth Embodiment

In order to achieve a high-speed operation in a phase change memory having a large capacity, it is important to reduce a resistance of a word line to shorten a rising time upon activation of the word line. In a sixth embodiment of the present invention, means for short-circuiting a metal wiring layer arranged in parallel with a gate electrode of polysilicon at a fixed interval is provided in order to reduce the wiring resistance of word lines in the memory cell. That is, a configuration example of a word-line-shunt cell will be described.

Figure 17:
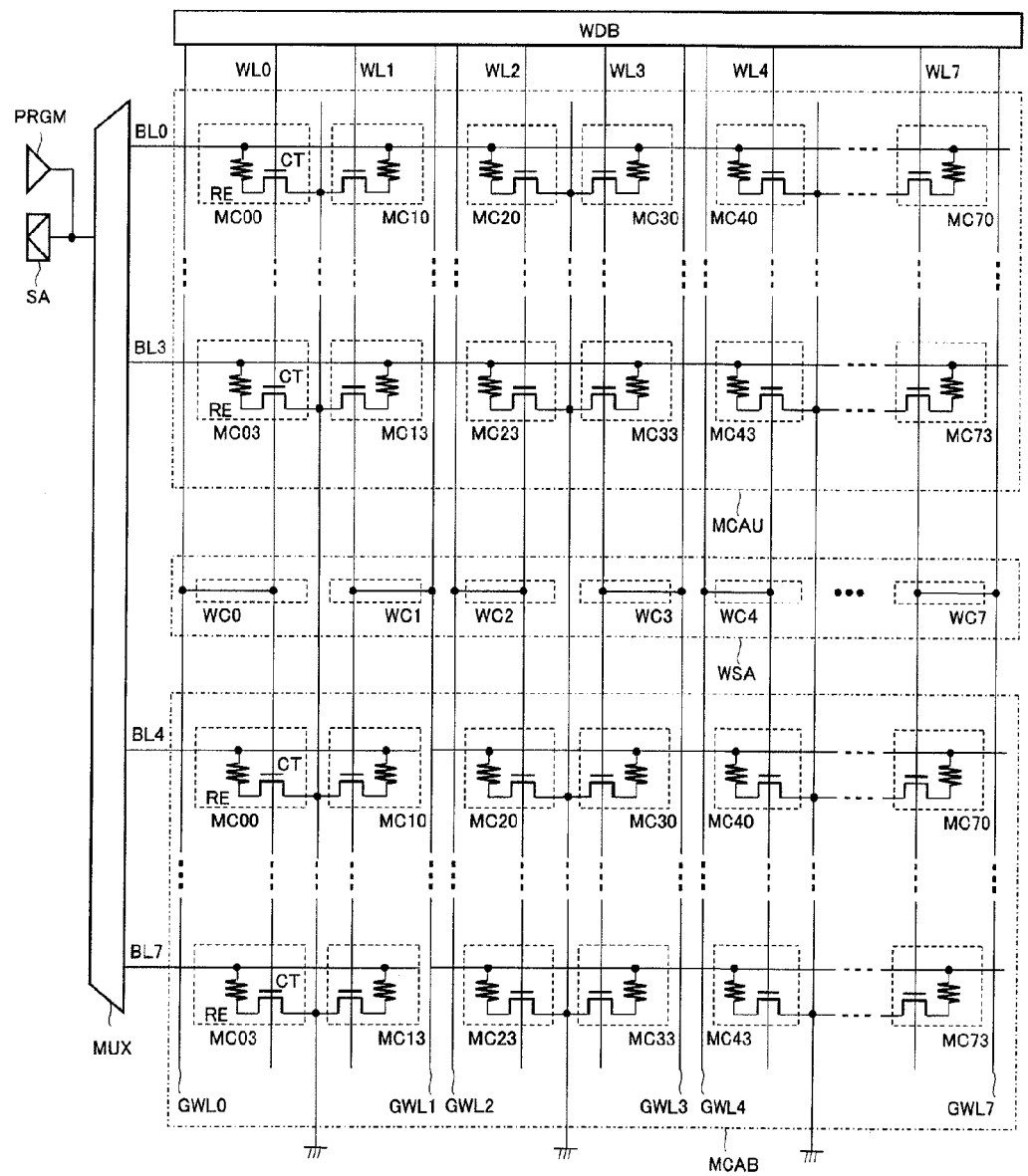
FIG. 17 is a diagram illustrating an example of a circuit configuration of a phase change memory included in a semiconductor device of a sixth embodiment.

FIG. 17 illustrates a diagram of a main block of a phase change memory according to the sixth embodiment. In FIG. 15, a configuration example in which the memory-cell array MCA is divided into two memory-cell arrays MCAU and MCAB and a word-line-shunt cell array WSA is disposed therebetween is illustrated for ease of description. The memory cell array MCAU includes memory cells MC00, MC10, . . . , MC70 arranged at respective intersection points of word lines WL0 to WL7 and bit-lines BL0 to BL3 in an array of 8 rows and 4 columns. In the same manner, the memory cell array MCAB includes memory cells MC00, MC10, . . . , MC70 arranged at respective intersection points of the word lines WL0 to WL7 and bit-lines BL4 to BL7 in an array of 8 rows and 4 columns. The word-line-shunt cell array WSA is configured by eight word-line-shunt cells WC0 to WC7 connecting the word lines WL0 to WL7 and global word lines GWL0 to GWL7 arranged in parallel with the respective word lines.

Figure 18A:
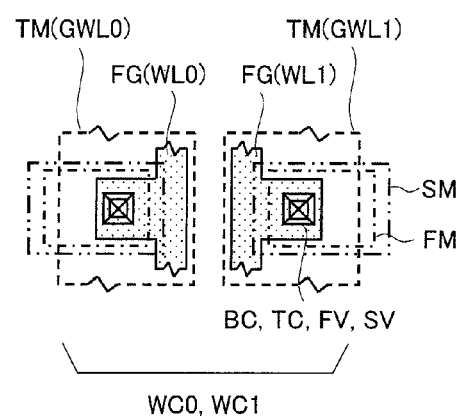
FIGS. 18A-18B are diagrams illustrating an example of a layout and a cross-section structure of the phase change memory illustrated in FIG. 17.
Figure 18B:
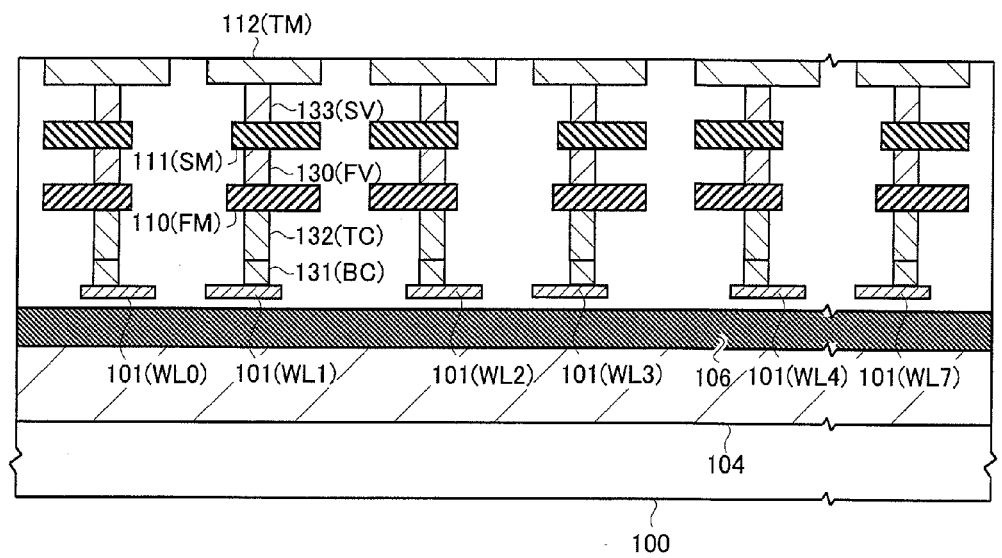

FIG. 18A illustrates a layout of the word-line-shunt cell array WSA of the phase change memory illustrated in FIG. 17, and FIG. 18B illustrates a cross-section structure of the same. As compared with the structure illustrated in FIG. 1, the resistive storage element (RL, 120), the active areas (AA0, AA1, . . . ), and the n+ diffusion layer (102) are removed from the memory cell, and word line shunt cells WC0, WC1, . . . , WC7 are formed on the insulator 106 for isolation. Further, the word line formed of polysilicon forms a convex-type layout pattern in an area where bottom contacts are formed. The word line is connected to a global word line formed of a third metal layer (TM, 112) via the top contact (TC, 132), the first metal layer (FM, 110), the via (FV, 130), the second metal layer (SM, 111), and the second via (SV, 133) which are formed on the same axis as that of the bottom contact (BC, 131).

By adopting such a structure, it is made possible to connect the word line formed of polysilicon and the global word line formed of the third metal layer to each other within the memory array, so that the wiring resistance of the word line can be reduced. Further, since formation can be made with the same area as that of the memory cell, area overhead of the memory-cell array can be suppressed, and shape variation of the memory cell can be suppressed by suppressing an area where the layout patterns of the memory cells become discontinuous. Thereby, a high-speed phase change memory having a small area and reduced electric characteristic variation can be achieved.

Seventh Embodiment

Figure 19:
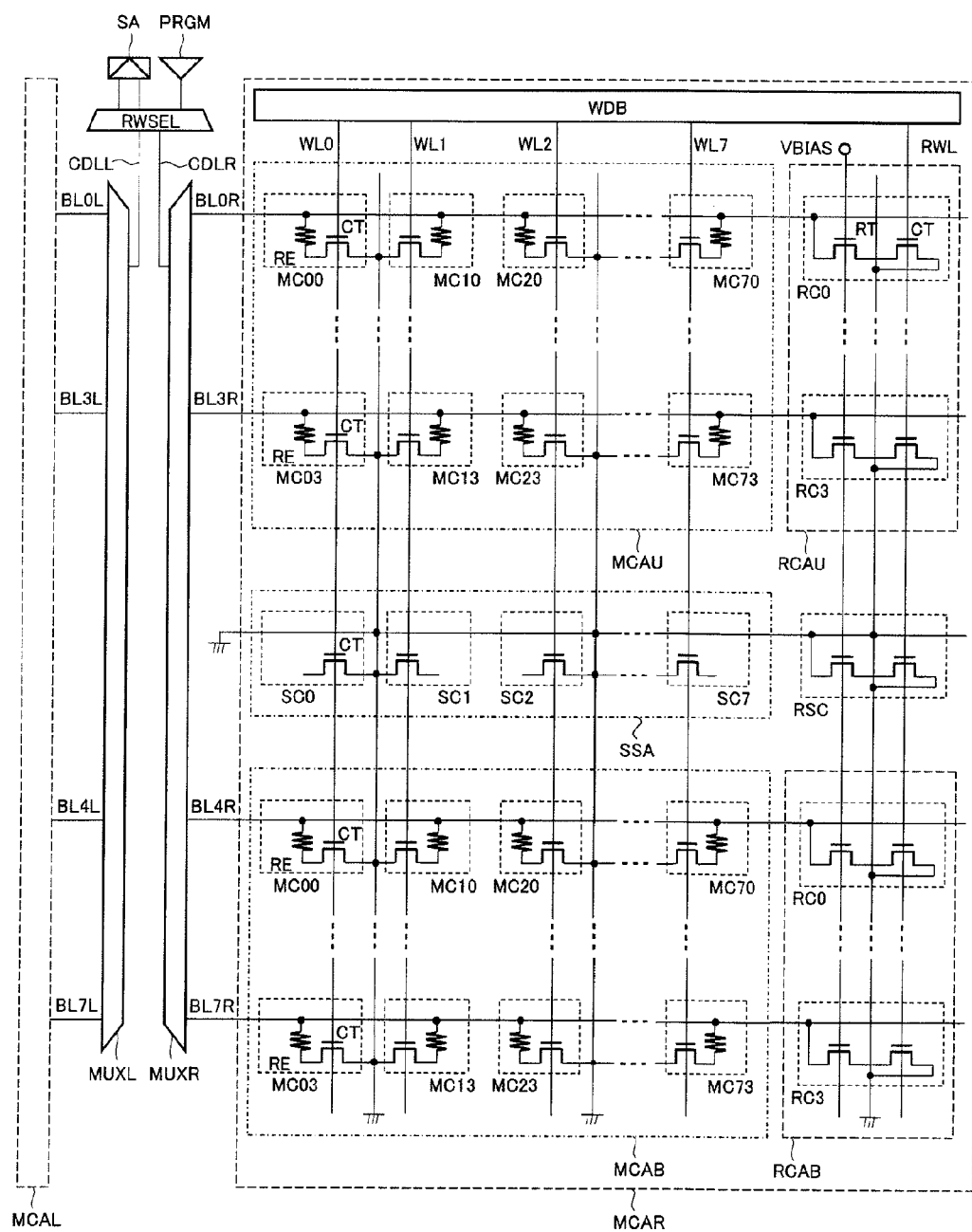
FIG. 19 is a diagram illustrating an example of a circuit configuration of a phase change memory in a semiconductor device of a seventh embodiment.

In a seventh embodiment of the present invention, a method to achieve a reference cell used for generation of a reference signal in a read operation of a phase change memory will be described. FIG. 19 illustrates a block diagram of a main portion of a phase change memory according to the seventh embodiment of the present invention. A feature of the seventh embodiment lies in that a reference cell is disposed on each bit-line in each of the memory-cell arrays MCAL and MCAR. With paying attentions to this point, a configuration of the phase change memory according to the seventh embodiment will be described in detail below.

The phase change memory illustrated in FIG. 19 includes a program circuit PRGM, a sense amplifier SA, a read/write circuit select circuit RWSEL, memory-cell arrays MCAL and MCAR, and multiplexers MUXL and MUXR. The read/write circuit select circuit RWSEL is a circuit block which connects one of the program circuit PRGM or the sense amplifier SA to a selected bit line via a common data line CDLL or CDLR and the multiplexer MUXL or MUXR. The multiplexer MUXL is a circuit block which selects one from the bit lines BL0L to BL7L in the memory-cell array MCAL to connect the selected one to the common data line CDLL. In the same manner, the multiplexer MUXR is a circuit block which selects one from the bit-lines BL0R to BL7R in the memory-cell array MCAR to connect the selected one to the common data line CDLR.

The memory-cell arrays MCAL and MCAR include a block of word drivers WDB, reference cell arrays RCAU, RCAB, and a reference cell source-shunt cell RSC in addition to the memory-cell arrays MCAU, MCAB and the source-shunt cell array SSA illustrated in FIG. 15. Among them, the reference cell array RCAU includes reference cells RC0 to RC3 arranged at intersection points of the bit-lines BL0R to BL3R and the reference word line RWL. Similarly, the reference cell array RCAB includes reference cells RC0 to RC3 arranged at intersection points of the bit-lines BL4R to BL7R and the reference word line RWL. Each of the reference cells RC0 to RC3 is formed of NMOS transistors RT and CT in a cascade connection between the bit-line BL0R and the ground voltage supply line, for example, like the reference cell RC0. The transistor CT has the same configuration as that of the select transistor in the memory cell. The reference word lines are selectively activated according to the memory cell selected. The transistor RT is designed such that its gate length LRT is longer than a gate length LCT of the select transistor CT. Further, a bias voltage VBIAS inputted into the gate electrode is controlled by a power source circuit (not illustrated). A feeder line of the bias voltage VBIAS is arranged in parallel with the reference word line RWL. With such a configuration, a driving current to the reference cell can be optimized so as to generate a desired reference signal.

The reference cell source shunt cell RSC is arranged at an intersection point of the ground voltage supply line and the reference word line RWL and it includes transistors RT and CT like the reference cell. A difference of the reference cell source shunt cell RSC from the reference cell lies in that a source terminal is connected to both a ground voltage supply line parallel to the reference word line RWL and a ground voltage supply line parallel to the bit line. Such connection can be easily understood from a layout and a cross-sectional view described later.

Figure 20A:
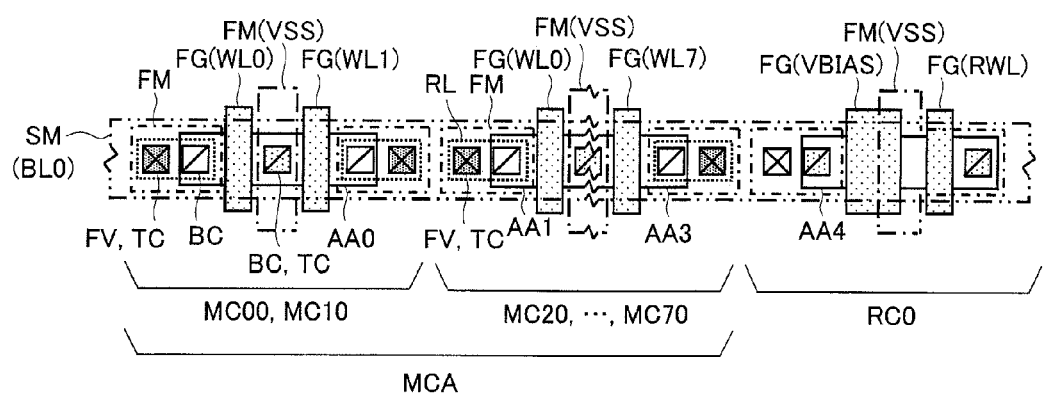
FIGS. 20A-20B are diagrams illustrating an example of a layout and a cross-section structure of the phase change memory illustrated in FIG. 19.
Figure 20B:
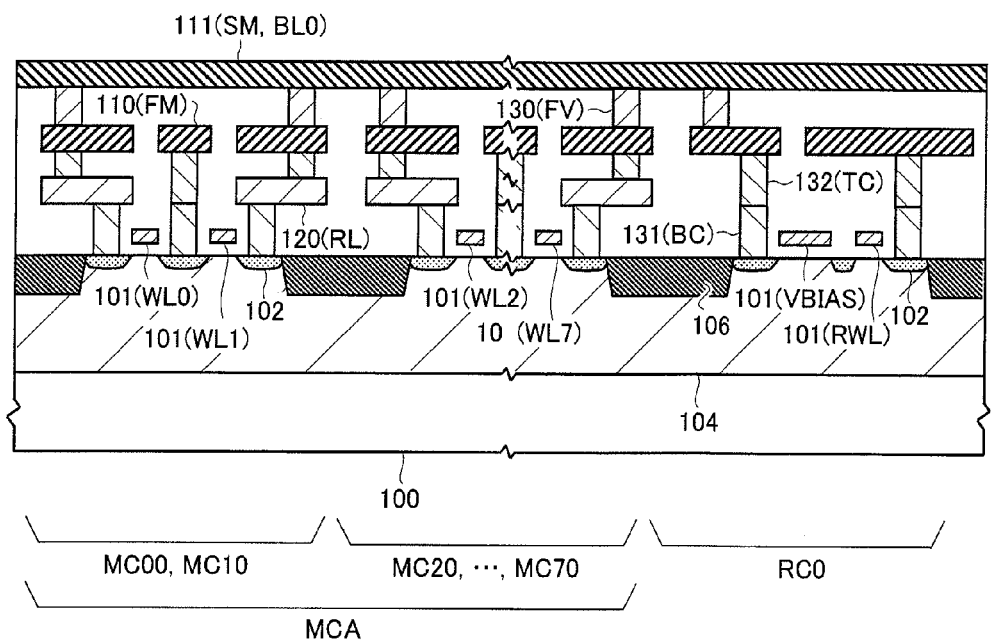

FIG. 20A illustrates a layout of the memory cells MC00 to MC70 and the reference cell RC0 in the bit-line BL0R, and FIG. 20B illustrates a cross-section structure of the same. The reference cell RC0 is formed on an activation area AA4 having the same area as that of activation areas AA0 to AA3 in which the memory cells MC00 to MC70 are formed. The source electrode of the transistor CT and the ground voltage supply line parallel with the reference word line are connected to each other by connecting an n+ diffusion layer 102 in the source electrode of the transistor CT to the convex-pattern first metal layer (FM, 110) via the bottom contact (BC, 131) and the top contact (TC, 132). The drain electrode of the transistor RT and the bit line BLR0 are connected to each other by connecting the n+ diffusion layer 102 in the drain electrode of the transistor RT to the second metal layer (SM, 111) via the bottom contact (BC, 131) and the top contact (TC, 132), and the first metal layer (FM, 110) and the first via (FV, 130) which are formed on the same axis.

Figure 21A:
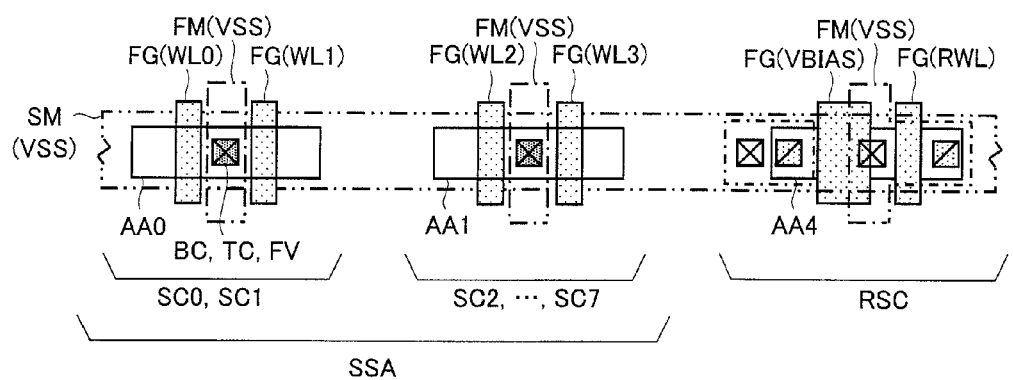
FIGS. 21A-21B are diagrams illustrating another example of a layout and a cross-section structure of the phase change memory illustrated in FIG. 19.
Figure 21B:
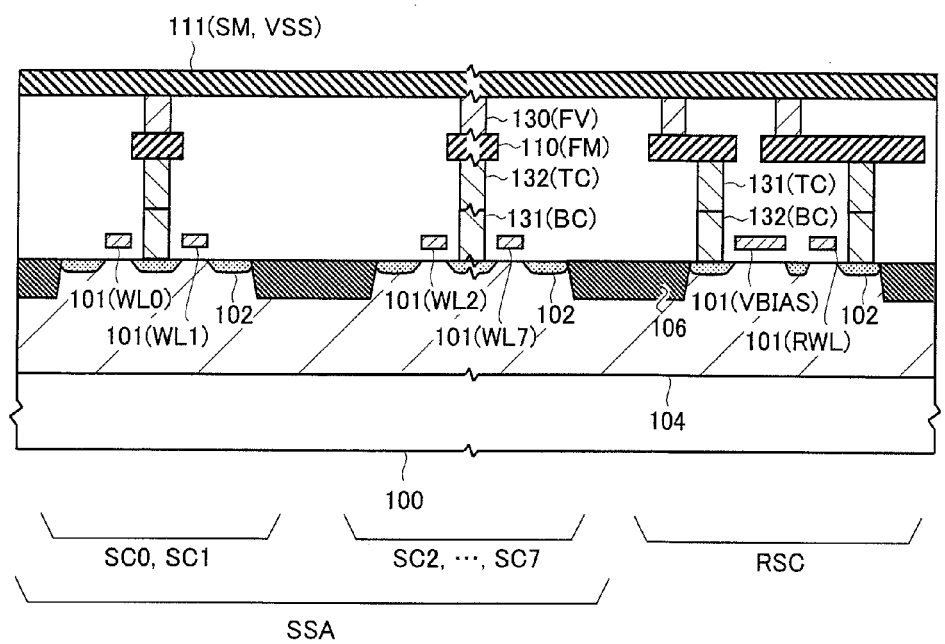

FIG. 21A illustrates a layout of a source-shunt cell array SSA and a reference cell source-shunt cell RSC and FIG. 21B illustrates a cross-section structure thereof. The reference cell source-shunt cell RSC is based upon the structure of the abovementioned reference cells RC0 to RC3. Further, the source electrode of the transistor CT and the ground voltage supply line arranged in parallel with the bit-line are connected to each other by connecting the first metal layer and the second metal layer via the first via (FV, 130).

By adopting such a reference cell structure, it is made possible to form the reference cells at the same pitch as that of the memory cells in the memory-cell array, and it is made possible to suppress shape variations of the memory cell and the reference cell. Thereby, it is possible to form a memory-cell array with a small area and reduced electric characteristic variation. The wiring resistance of the source line in the reference cell can be reduced by using the reference cell source-shunt cell RSC. Further, a read operation of a configuration called open-type bit line configuration can be performed by causing two memory-cell arrays MCAL and MCAR to share the program circuit PRGM and the sense amplifier SA and using one of the memory-cell arrays for read while using the other for reference signal generation.

Eighth Embodiment

In an eighth embodiment of the present invention, another programming operation of memory cells and memory-cell arrays of a phase change memory will be described. A feature of the eighth embodiment of the present invention lies in that an activation time of a word line is changed according to an operation in a memory-cell array in which each memory cell has a 2T1R configuration (two transistors and one resistive storage element), as described in Patent Document 3.

FIG. 22 illustrates a memory cell array TMCA in a phase change memory according to the present invention. In FIG. 22, an example in which the memory cell array TMCA includes memory cells MC00 to MC77 arranged in 8 rows and 8 columns is described for simplification. The memory cell includes NMOS transistors CT0 and CT1 and a resistive storage element RE, for example, as illustrated in MC00. The resistive storage element RE is inserted between the bit-line BL0 and two transistors CT0 and CT1. The two transistors CT0 and CT1 are controlled by word lines WL00 and WL01, respectively. Further, source electrodes of the transistors CT0 and CT1 are connected to source electrodes of transistors of adjacent memory cells.

Figure 2:
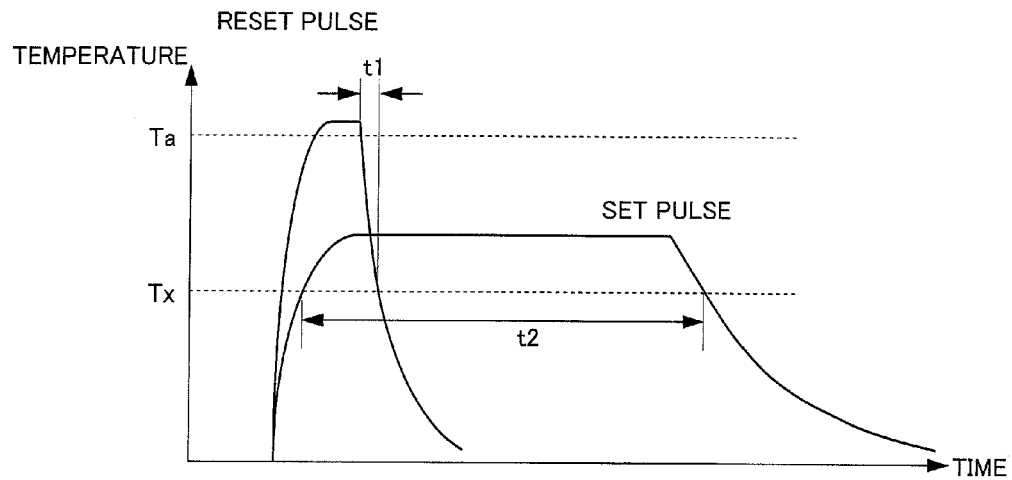
FIG. 2 is a graph illustrating a relationship between a pulse width and a temperature required for phase change of a resistance device using a phase change material.

FIGS. 23A-23F illustrate operations of the memory cell according to the eighth embodiment. In FIG. 23, operation voltage waveforms of the word lines WL00 and WL01 and the bit-line BL0 are illustrated with paying attention to the memory cell MC00. FIG. 23A illustrates an operation for activating two word lines simultaneously to apply a program current ICELL to a memory cell. Here, the program current ICELL is controlled by a bit-line voltage BL0 applied according to program information. In the case of a reset operation for changing the resistance of the resistive storage element to a high resistance, a pulse with large amplitude and a short duration is applied to the bit-line. On the other hand, in the case of a set operation for changing the resistance of the resistive storage element to a low resistance, a pulse with small amplitude and a relatively long duration is applied to the bit-line. The operation described in FIG. 2 is achieved according to these operations. Incidentally, since the phase change memory does not require the so-called erase operation such as that performed in a flash memory, it is possible to perform an operation for selectively applying a reset pulse or a set pulse according to storage information, as illustrated in FIG. 23A. The programming time can be reduced according to such an operation.

FIG. 23B illustrates a modified example of the operation illustrated in FIG. 23A. The feature of the modified example lies in that a slowly-cooling pulse is applied to a bit line such as that described in Non-Patent Document 2. By extending a falling time of the pulse, it is made possible to achieve an optimal crystallization temperature for each cell so that resistance variation after 'set' can be suppressed.

FIG. 23C illustrates an example of another word line driving method. A feature of this operation lies in that a set operation is performed by driving word lines WL00 and WL01 in a two-stage manner. That is, in a first period, the resistive storage element is once melted by application of, a pulse with large amplitude. In a second period subsequent to the first period, the storage element is maintained in a temperature suitable for its crystallization by amplitude suppression. High speed of the set operation such as that described in Non-Patent Document 3 can be realized by performing such an operation.

FIG. 23D illustrates an example of still another word line driving method. A feature of this operation lies in raising the word lines WL00 and WL01 at different timings. That is, in a first period, the storage element is once melted even when any storage information is written by activating two word lines WL00 and WL01. In a second period subsequent to the first period, by raising one word line WL00, the other word line WL01 is held in the activated state. By such control, it is made possible to suppress a cell driving current ICELL at the set operation to hold the temperature of the storage element in a temperature suitable for crystallization. By controlling a cell current by a binary voltage drive, an effect similar to the effect obtained by the operation illustrated in FIG. 23C can be obtained with a simple circuit configuration.

FIG. 23E illustrates an example of still another word line driving method. A feature of this operation lies in a combination of the control of the word line illustrated in FIG. 23D and the operation for performing application of the slowly-cooling pulse to the bit line in the second period illustrated in FIG. 23B. Both high speed of the set operation and suppression of resistance variation after set can be achieved by performing such control.

FIG. 23F illustrates an example of an operation in which the bit line BL0 is applied with a two-staged pulse such as that described in Non-Patent Document 3 instead of the slowly-cooling pulse. In this case, the cell driving current ICELL can be optimized like a slope pulse and a configuration of the driving circuit can be simplified by changing the bit line from analog driving method to a ternary driving.

According to the abovementioned configurations and operations, the following effects can be obtained. That is, it is made possible to achieve a memory cell, in which a gate width of a select transistor is large, with a small area by excluding a isolation area and forming 2T1R cells as illustrated in FIG. 22. Further, as illustrated in FIG. 23, by controlling two word lines individually, it is made possible to realize control of cell current by a binary driving to the word lines. Thereby, a set operation with a high speed and reduced resistance variation can be realized with a simple circuit configuration. Incidentally, in the above description, the example of the operation of controlling a voltage of a word line or a bit-line such that crystallization is performed once a storage element is melted has been described. However, the principle of programming operation is not limited to the above-described operation, and various modified examples can be adopted. For example, a programming operation of, once raising the temperature of the storage element to a temperature optimal for crystal core growth without melting the storage element, lowering the temperature of the storage element to such a temperature that crystal growth becomes optimal can be used depending on the composition or the shape of the storage element. In this case, it is made possible to achieve a desired programming operation simply by controlling a program current using the program system of the present embodiment.

Ninth Embodiment

In an ninth embodiment of the present invention, a buffer cell structure in the phase change memory cell having the 2T1R configuration described in the eighth embodiment will be described. A feature of the buffer cell lies in that the contact on the resistive storage element is removed from the structure arranged around the memory array and the resistive storage element and the bit line are disconnected from each other, as described in the first embodiment.

FIG. 24 illustrates a memory-cell array TMCA and buffer-cell arrays YLTBCA and YRTBCA in a phase change memory according to the present invention. The memory-cell array TMCA is the same as that illustrated in FIG. 22, and an example including memory cells MC00 to MC77 arranged in 8 rows and 8 columns is illustrated for simplification. The buffer-cell arrays YLTBCA and YRTBCA each includes buffer cells TBC0 to TBC7 arranged in 1 row and 8 columns. Each of the buffer cells TBC0 to TBC7 includes two transistors CT0 and CT1 and a resistive storage element RE like the memory cell. Further, connection of the resistive storage element RE and the bit-line is cut, as described previously.

FIG. 25A illustrates a layout of memory cells MC00 to MC70 in the bit line BL0 and buffer cells TBC0 arranged at both ends of the bit line BL0, FIG. 25B illustrates a cross-section structure of the same in a cross-section taken along AA' in FIG. 25A and FIG. 25C illustrates a cross-section structure of the same in a cross-section taken along BB' in FIG. 25A. A feature of these cells lies in that they are formed on one active area pattern AA without formation of an insulator for isolation in a direction of a bit line. The resistive storage element (RL, 120) is arranged such that its longitudinal direction is parallel to a word line.

In the cross-section AA', a resistive storage element within a memory cell is connected to the bit-line BL0 formed of a second metal layer (SM, 111) via a top contact (TC, 132), a first metal layer (FM, 110), and a first via (FV, 130). On the other hand, in a buffer cell TBC0 in the buffer-cell arrays YLTBCA and YRTBCA, the contact on the resistive storage element is removed and connection of the buffer cell TBC0 with the bit line is cut.

In the cross-section BB', a resistive storage element within a memory cell is connected to an active area (AA, 102) corresponding to a drain electrode of transistors CT0 and CT1 via a bottom contact (BC, 131). Further, the active area (AA, 102) corresponding to a source electrode of the transistors CT0 and CT1 are connected to a ground voltage supply line formed of the first metal layer (FM, 110) via the bottom contact (BC, 131) and the top contact (TC, 132). A structure of the buffer cell TBC0 in the buffer-cell arrays YLTBCA and YRTBCA are similar to that of the memory cell.

By adopting such a configuration, the configuration in which the top contact is excluded from the buffer cell is obtained, so that there is not a concern about exposure or sublimation of the chalcogenide film 301 at a top contact formation time, as described in the first embodiment. Thereby, it is made possible to prevent contamination of the manufacturing apparatus and production throughput is improved.

Incidentally, in FIG. 24, the configuration in which the buffer cells have been arranged at both ends of the bit line has been illustrated for ease of description. As described in the first embodiment, however, misalignment of the top contact hole or an area where the thickness of the Interlayer Dielectric film is uneven may also occur at both ends of the word line. In this case, exposure or sublimation of the chalcogenide film can be avoided by arranging buffer cells at both ends of the word line like the bit-line. Further, electric characteristic variation due to shape variation of a memory cell can be suppressed by further arranging a top contact outside the buffer cell, as described in FIGS. 10A-10B in the second embodiment.

Tenth Embodiment

In a tenth embodiment of the present invention, another buffer cell structure and another memory-cell array of the phase change memory cell with the 2T1R configuration will be described. The feature of the tenth embodiment lies in that the resistive storage element RE has been removed from the buffer cell, as illustrated in FIGS. 11 to 13. FIG. 26 illustrates another example of the buffer-cell arrays YLTBCA and YRTBCA in the phase change memory according to the tenth embodiment of the present invention. A memory cell array TMCA has a configuration similar to that illustrated in FIG. 24. The buffer-cell arrays YLTBCA and YRTBCA include buffer cells TBC0 to TBC7 including select transistors CT0 and CT1.

FIG. 27A illustrates a layout of memory cells MC00 to MC70 on a bit-line BL0 and buffer cells TBC0 arranged at both ends of the bit-line BL0, FIG. 27B illustrates a cross-section structure in a cross-section taken along AA' in FIG. 27A, and FIG. 27C illustrates a cross-section structure in a cross-section taken along BB' in FIG. 27A. These cells are formed in one active area AA like the structure illustrated in FIG. 25. Further, a resistive storage element (RL, 120) is arranged in only the memory cells MC00 to MC70 such that its longitudinal direction is parallel to a word line.

In the cross-section AA', a resistive storage element within a memory cell is connected to a bit-line BL0 formed of a second metal layer (SM, 111) via a top contact (TC, 132), a first metal layer (FM, 110), and a first via (FV, 130). On the other hand, in a buffer cell TBC0 in the buffer-cell arrays YLTBCA and YRTBCA, the resistive storage element is removed and a top contact (TC, 132) and the first via (FV, 130) are formed above and below the first metal layer (FM, 110) like the memory cell.

In the cross-section BB', a resistive storage element within a memory cell is connected to an active area (AA, 102) corresponding to a drain electrode of the transistors CT0 and CT1 via a bottom contact (BC, 131). Further, the active area (AA, 102) corresponding to a source electrode of the transistors CT0 and CT1 are connected to a ground voltage supply line formed of the first metal layer (FM, 110) via the bottom contact (BC, 131) and the top contact (TC, 132). A structure of a buffer cell TBC0 in the buffer-cell arrays YLTBCA and YRTBCA is similar to that of the memory cell. By adopting such a configuration, an effect similar to that of the eighth embodiment can be obtained.

Incidentally, in FIG. 26, the configuration in which the buffer cells are arranged at both the ends of the bit-line has been illustrated for ease of description. As described in the third embodiment, however, misalignment of the top contact hole or an area where the thickness of the Interlayer Dielectric film is uneven may also occur at both ends of the word line. In this case, exposure or sublimation of the chalcogenide film can be avoided by arranging buffer cells at both ends of the word line like the bit-line. Further, electric characteristic variation due to shape variation of a memory cell can be suppressed by further arranging a resistive storage element outside the buffer cell, as described in FIGS. 10A-10B in the second embodiment.

In the foregoing, the invention made by the inventors of the present invention has been concretely described based on the embodiments; however, it is needless to say that the present invention is not limited to the foregoing embodiments and various modifications and alterations can be made within the scope of the present invention. Also, the above-described first to tenth embodiments can be mutually combined in any way.

For example, a scale of the buffer cell can be changed according to performance of a manufacturing apparatus. The configuration in which cells are arranged two by two between the sense amplifier and the block of word drivers has been described hereinabove, but a configuration in which cells are arranged one by one therebetween can be also adopted. In this case, a smaller memory-cell array can be achieved. On the other hand, when misalignments of the top contact holes spread over a wide range or an Interlayer Dielectric film becomes thin over a wide range, exposure or sublimation of the chalcogenide film can be avoided by increasing the number of buffer cells.

The embodiments of the present invention have hereinabove been described using the phase change memory where the resistive storage element has the chalcogenide film as the example, but the resistive storage element is not limited to this configuration. For example, the present invention can also be applied to an MRAM or RRAM using a magnetic material and exposure or sublimation of the resistive storage element can be avoided like the phase change memory.

INDUSTRIAL APPLICABILITY

Since exposure or sublimation of a chalcogenide film can be avoided at a formation time of a top contact hole by providing an area where a resistive storage element or a structure where a top contact is removed between a memory-cell array and sense amplifier and a block of word drivers, a phase change memory can be manufactured without contaminating a manufacturing apparatus.

The invention claimed is:
1. A semiconductor device comprising:
a plurality of word lines;
a plurality of bit-lines intersecting the plurality of word lines;
a plurality of memory cells arranged at intersection points of the plurality of word lines and the plurality of bit-lines;
a block of word drivers for controlling the plurality of word lines;
a sense amplifier for discriminating read signals generated in the plurality of bit-lines;
a first voltage supply line arranged in parallel with the plurality of bit-lines;
a first plurality of buffer cells which are arranged at intersection points of the plurality of word lines and the first voltage supply line and are not connected to the first voltage supply line;
a second voltage supply line arranged in parallel with the plurality of word lines; and
a second plurality of buffer cells which are arranged at intersection points of the plurality of bit-lines and the second voltage supply line and are not connected to the plurality of bit-lines, wherein
the first plurality of buffer cells are arranged between the block of word drivers and the plurality of memory cells,
the second plurality of buffer cells are arranged between the sense amplifier and the plurality of memory cells, and
each of the plurality of memory cells includes a first resistive storage element and a first select transistor.
2. The semiconductor device according to claim 1, wherein
the second voltage supply line is formed of a first metal layer,
the plurality of bit-lines and the first voltage supply line are formed of a second metal layer, respectively,
a first contact layer is formed below the first metal layer,
the first resistive storage element is formed below the first contact layer so as to be in contact with the first contact layer, and the first and second pluralities of buffer cells include a second select transistor having the same shape as that of the first select transistor.

3. The semiconductor device according to claim 1, wherein the first and second pluralities of buffer cells further include a second resistive storage element having the same shape as that of the first resistive storage element, and the second resistive storage element is covered with a first insulator and is not in contact with the first contact layer.

4. The semiconductor device according to claim 1, wherein the first resistive storage element includes a chalcogenide film.

5. The semiconductor device according to claim 3, wherein the first and second resistive storage elements include a chalcogenide film.

6. The semiconductor device according to claim 1, wherein each of the plurality of memory cells further includes a third select transistor, and each of the first and second pluralities of buffer cells further include a fourth select transistor having the same shape as that of the third select transistor.

7. The semiconductor device according to claim 5, wherein the first resistive storage element includes a chalcogenide film.

8. The semiconductor device according to claim 6, wherein the first and third transistors are independently driven at a reset/set operation time so that a current flowing in the first resistive storage element is controlled.

9. The semiconductor device according to claim 1, wherein a second plurality of contact layers having the same shape as that of the first contact layer are formed between the first plurality of buffer cells and the block of word drivers, and a third plurality of contact layers having the same shape as the first contact layer are formed between the second plurality of buffer cells and the sense amplifier.

10. The semiconductor device according to claim 3, wherein a second plurality of contact layers having the same shape as that of the first contact layer are formed between the first plurality of buffer cells and the block of word drivers, and a third plurality of contact layers having the same shape as the first contact layer are formed between the second plurality of buffer cells and the sense amplifier.

11. The semiconductor device according to claim 10, wherein the first and second resistive storage elements include a chalcogenide film.

12. A method of manufacturing a semiconductor device having a memory cell including a select transistor and a resistive storage element, the method comprising the steps of:

forming the select transistor configuring the memory cell on a semiconductor substrate;

forming a first resistive storage element configuring the memory cell and a second resistive storage element configuring a buffer cell to be arranged around the memory cell;

forming a first insulator covering the first and second resistive storage elements;

forming a first contact layer in contact with the first resistive storage element and is not contact with the second resistive storage element within the first insulator;

forming a first metal layer configuring a second voltage supply line arranged in parallel with a word line; and forming a second metal layer configuring a bit-line and a first voltage supply line arranged in parallel with the bit-line.

* * * * *